United States Patent
McMullan et al.

(10) Patent No.: US 9,583,609 B2
(45) Date of Patent: Feb. 28, 2017

(54) MOS TRANSISTOR STRUCTURE AND METHOD OF FORMING THE STRUCTURE WITH VERTICALLY AND HORIZONTALLY-ELONGATED METAL CONTACTS

(71) Applicant: Texas Instruments Incorporated, Dallas, TX (US)

(72) Inventors: Russell Carlton McMullan, Allen, TX (US); Kamel Benaissa, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/850,192

(22) Filed: Mar. 25, 2013

(65) Prior Publication Data

US 2014/0284725 A1     Sep. 25, 2014

(51) Int. Cl.
| | |
|---|---|
| H01L 29/66 | (2006.01) |
| H01L 29/78 | (2006.01) |
| H01L 21/311 | (2006.01) |
| H01L 21/8234 | (2006.01) |
| H01L 21/8238 | (2006.01) |
| H01L 27/02 | (2006.01) |
| H01L 21/768 | (2006.01) |

(52) U.S. Cl.
CPC ........ *H01L 29/78* (2013.01); *H01L 21/31144* (2013.01); *H01L 21/76816* (2013.01); *H01L 21/76897* (2013.01); *H01L 21/823475* (2013.01); *H01L 21/823871* (2013.01); *H01L 27/0207* (2013.01); *H01L 29/665* (2013.01); *H01L 29/7833* (2013.01)

(58) Field of Classification Search
USPC ......... 257/382, E21.023; 438/671, 717, 721, 438/736
See application file for complete search history.

(56) References Cited

U.S. PATENT DOCUMENTS

| | | | | |
|---|---|---|---|---|
| 5,067,002 | A * | 11/1991 | Zdebel et al. | 257/756 |
| 2005/0221233 | A1 * | 10/2005 | Minvielle et al. | 430/313 |
| 2014/0227877 | A1 * | 8/2014 | Farber et al. | 438/701 |

\* cited by examiner

*Primary Examiner* — Ori Nadav
*Assistant Examiner* — Vernon P Webb
(74) *Attorney, Agent, or Firm* — Jacqueline J. Garner; Charles A. Brill; Frank D. Cimino

(57) ABSTRACT

Elongated metal contacts with longitudinal axes that lie in a first direction are formed to make electrical connections to elongated source and drain regions with longitudinal axes that lie in the first direction, and elongated metal contacts with longitudinal axes that lie a second direction are formed to make electrical connections to elongated source and drain regions with longitudinal axes that lie the second direction, where the second direction lies orthogonal to the first direction.

17 Claims, 24 Drawing Sheets

MOS TRANSISTOR STRUCTURE AND METHOD OF FORMING THE STRUCTURE WITH VERTICALLY AND HORIZONTALLY-ELONGATED METAL CONTACTS

BACKGROUND OF THE INVENTION

1. Field of the Invention

The present invention relates to a MOS transistor structure and, more particularly, to a MOS transistor structure and a method of forming the structure with vertically and horizontally-elongated metal contacts.

2. Description of the Related Art

A metal oxide semiconductor (MOS) transistor is a well-known semiconductor device which can be implemented as either an n-channel (NMOS) device or a p-channel (PMOS) device. A MOS transistor has spaced-apart source and drain regions, which are separated by a channel, and a gate that lies over the channel. The gate is insulated from the channel by a gate dielectric layer.

A metal-gate MOS transistor is a type of MOS transistor that utilizes a metal gate and a high-k gate dielectric layer. Current-generation methods, e.g., 20 nm and below, fabricate metal-gate MOS transistors by forming the source and drain regions, the channel, the gate dielectric layer, and the gate as elongated structures.

Metal-gate MOS transistors are connected to a metal interconnect structure that electrically connects the MOS transistors together to form an electrical circuit. The metal interconnect structure includes layers of metal traces that are electrically isolated from each other by layers of isolation material, and metal vias that extend through the layers of isolation material to electrically connect adjacent layers of metal traces.

The metal interconnect structure also includes metal contacts that extend through the bottom layer of isolation material to make electrical connections to the source and drain regions of the MOS transistors. The metal contacts are formed in metal contact openings that extend through the bottom layer of isolation material to expose the source and drain regions.

Conventionally, the metal contacts are fabricated by forming a patterned hard mask on the bottom layer of isolation material. The patterned hard mask has a number of square openings that lie over the source and drain regions. Once the patterned hard mask has been formed, the bottom isolation layer is etched.

The etch forms source metal contact openings that expose the source regions, and drain metal contact openings that expose the drain regions. The source metal contact openings and the drain metal contact openings are square as a result of the square openings in the patterned hard mask. The patterned hard mask is then removed.

After this, silicide layers are formed on the exposed source and drain regions, followed by the formation of metal contacts that lie in the source and drain metal contact openings, and touch the source and drain silicide layers and the bottom isolation layer. The metal contacts are square as a result of the square source and drain metal contact openings.

SUMMARY OF THE INVENTION

The present invention provides a method of forming a semiconductor structure that has elongated metal contacts with longitudinal axes which lie in a first direction, and elongated metal contacts with longitudinal axes which lie in a second orthogonal direction. The method includes forming a hard mask that touches and lies over a dielectric layer. The dielectric layer has a top surface. The method also includes etching the hard mask to form a first elongated opening and a second elongated opening. The first elongated opening has a bottom surface that lies above and spaced apart from the top surface of the dielectric layer, and a longitudinal axis that lies in a first direction. The second elongated opening has a bottom surface that lies above and spaced apart from the top surface of the dielectric layer, and a longitudinal axis that lies in a second direction. The second direction is substantially orthogonal to the first direction. In addition, the method includes etching the hard mask to form a third elongated opening and a fourth elongated opening after the first elongated opening and the second elongated opening have been formed. The third elongated opening exposes a first region on the top surface of the dielectric layer, and has a longitudinal axis that lies in the first direction. The fourth elongated opening exposes a second region on the top surface of the dielectric layer, and has a longitudinal axis that lies in the second direction.

The method of the present invention alternately includes forming a hard mask on a dielectric layer, and forming a first patterned photoresist layer on the hard mask. The forming the first patterned photoresist layer includes projecting a first imaging light onto a photoresist layer. The first imaging light has a strong dipole component in the first direction. The method also includes etching the hard mask exposed by the first patterned photoresist layer to form a first elongated opening and a second elongated opening. The first elongated opening has a bottom surface that lies above and spaced apart from a top surface of the dielectric layer, and a longitudinal axis that lies in the first direction. The second elongated opening has a bottom surface that lies above and spaced apart from the top surface of the dielectric layer, and a longitudinal axis that lies in a second direction. The second direction is substantially orthogonal to the first direction. Further, the method includes removing the first patterned photoresist layer, and forming a second patterned photoresist layer on the hard mask after the first patterned photoresist layer has been removed. The forming the second patterned photoresist layer includes projecting a second imaging light onto a photoresist layer. The second imaging light has a strong dipole component in the second direction. In addition, the method includes etching the hard mask exposed by the second patterned photoresist layer to form a third elongated opening and a fourth elongated opening. The third elongated opening exposes a first region on the top surface of the dielectric layer, and has a longitudinal axis that lies in the first direction. The fourth elongated opening exposes a second region on the top surface of the dielectric layer, and has a longitudinal axis that lies in the second direction.

The present invention also includes a semiconductor structure. The semiconductor structure includes rows and columns of first MOS transistors. Each first MOS transistor has a first elongated source region with a longitudinal axis that lies in a first direction. The semiconductor structure also includes rows and columns of second MOS transistors. Each second MOS transistor has a second elongated source region with a longitudinal axis that lies in a second direction. The second direction is substantially orthogonal to the first direction. Further, the semiconductor structure includes a dielectric layer that touches and lies over the first and second MOS transistors. In addition, the semiconductor structure includes a plurality of elongated metal contacts that extend through the dielectric layer. A first number of the plurality of elongated metal contacts have longitudinal axes that lie in the first direction, and make electrical connections to the first elongated source regions. A second number of the plurality of elongated metal contacts have longitudinal axes that lie in the second direction, and make electrical connections to the second elongated source regions.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 1A-8A are plan views. FIGS. 1B-8B are cross-sectional views taken along lines 1B-1B through 8B-8B of FIGS. 1A-8A. FIGS. 1C-8C are cross-sectional views taken along lines 1C-1C through 8C-8C of FIGS. 1A-8A. FIGS. 1D-8D are cross-sectional views taken along lines 1D-1D through 8D-8D of FIGS. 1A-8A. FIGS. 1E-8E are cross-sectional views taken along lines 1E-1E through 8E-8E of FIGS. 1A-8A.

DETAILED DESCRIPTION OF THE INVENTION

Figure 1A:
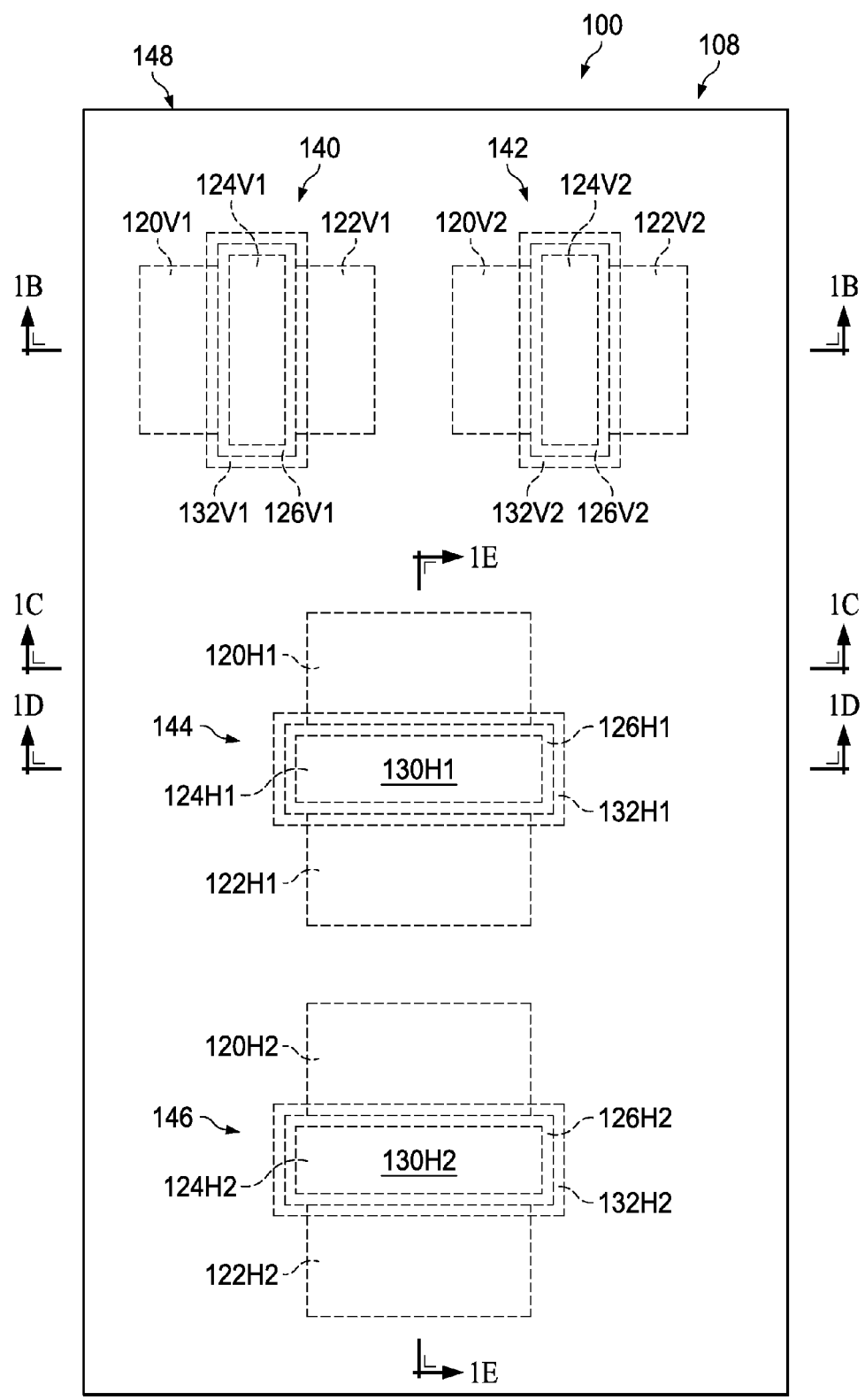
FIGS. 1A-1E through 8A-8E are views illustrating an example of a method 100 of forming a MOS transistor structure with vertically and horizontally-elongated metal contacts in accordance with the present invention.
Figure 1B:
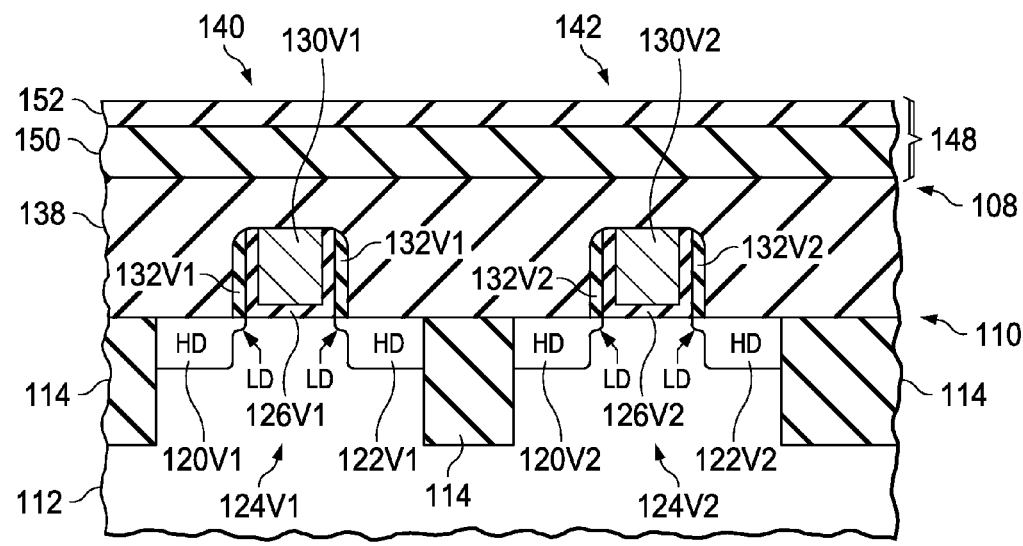
Figure 1C:
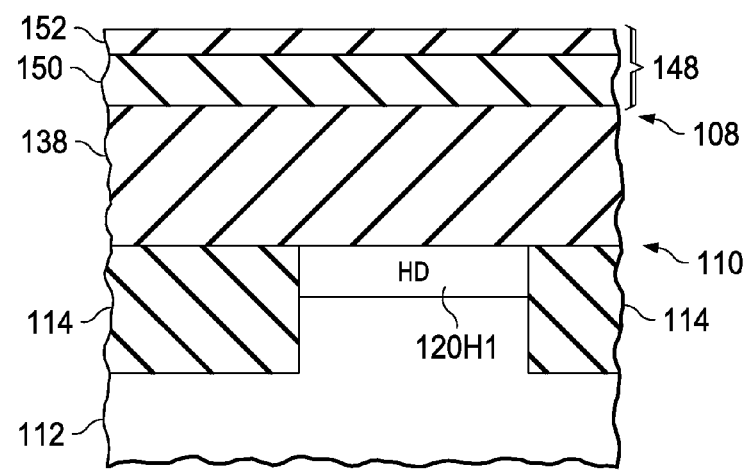
Figure 1D:
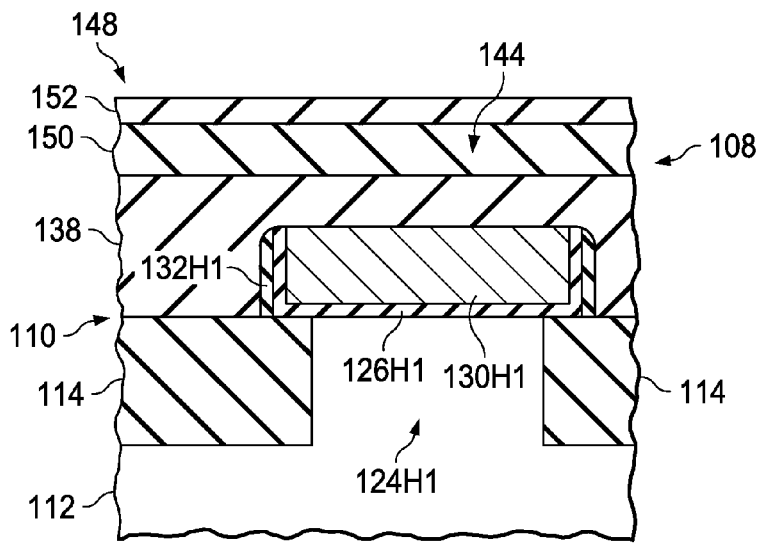
Figure 1E:
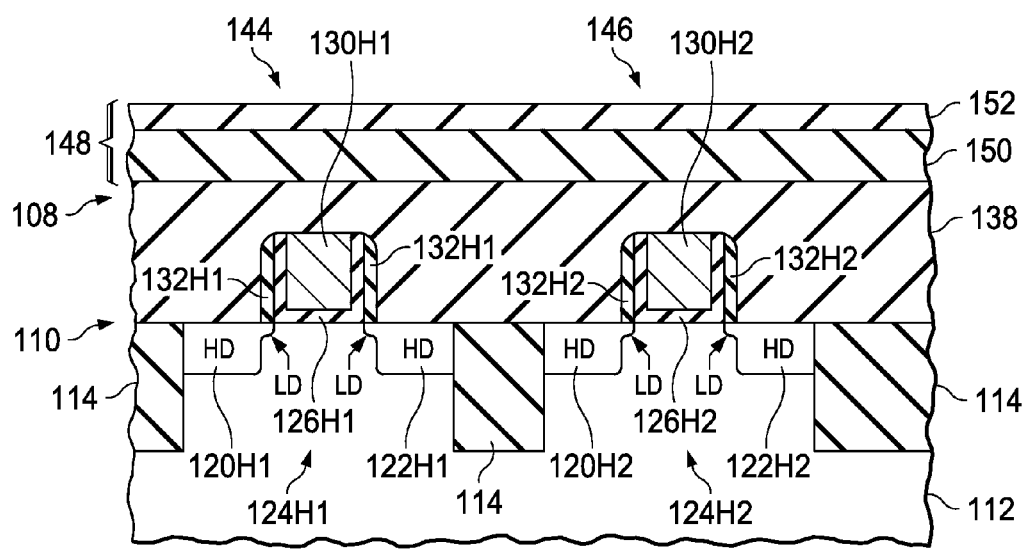
Figure 2A:
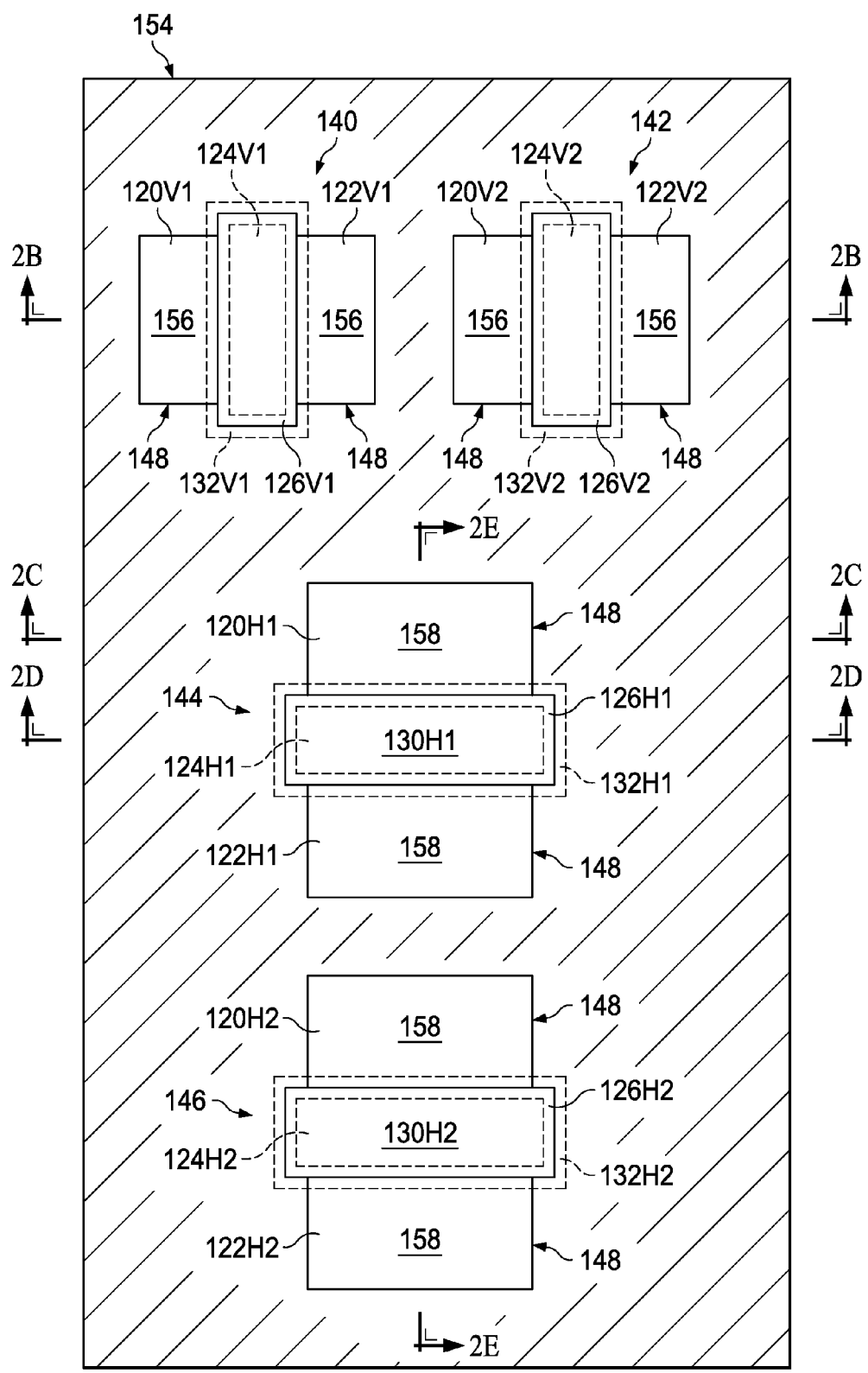
Figure 2B:
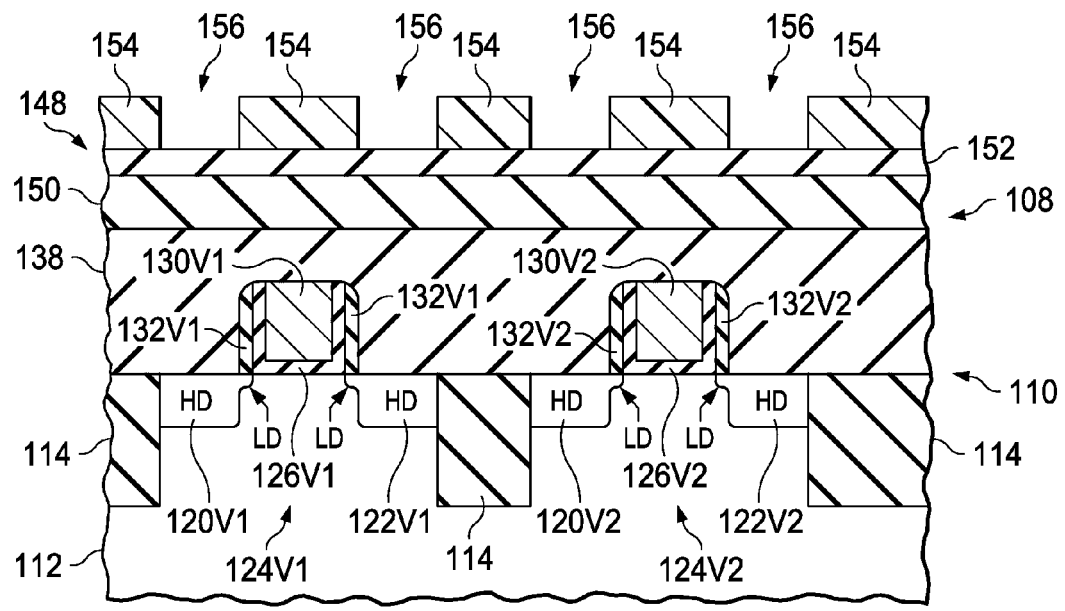
Figure 2C:
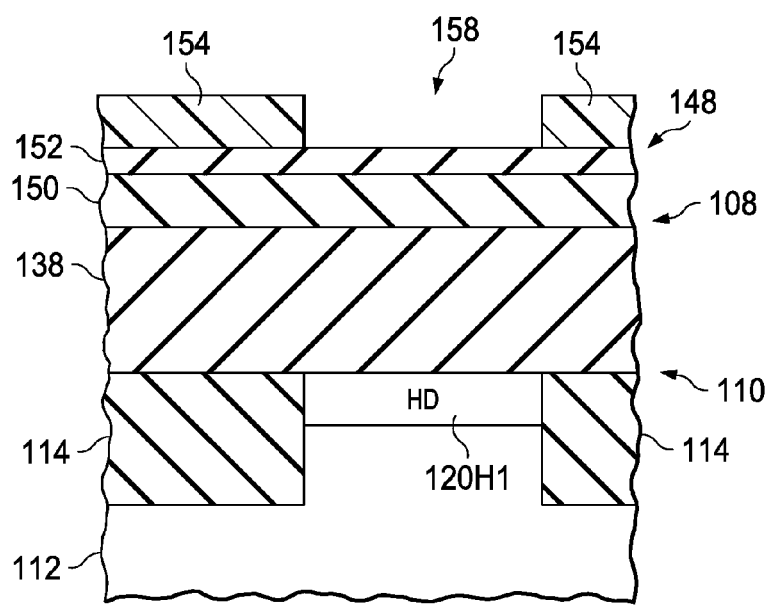
Figure 2D:
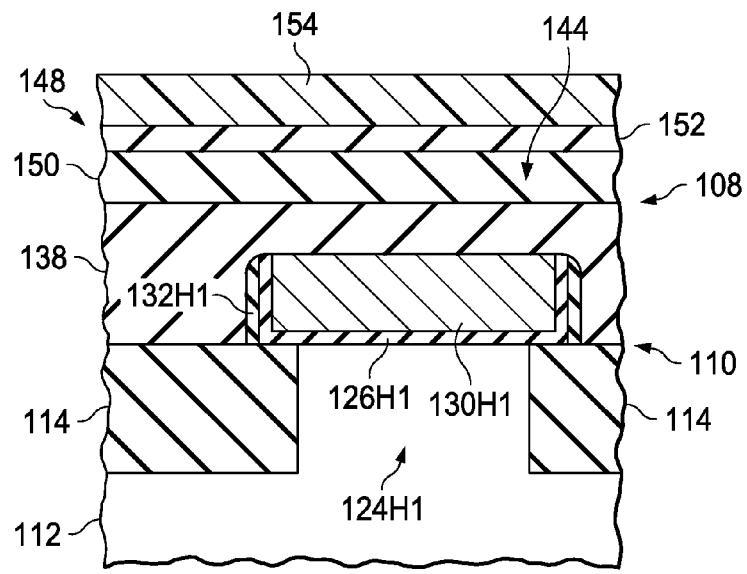
Figure 2E:
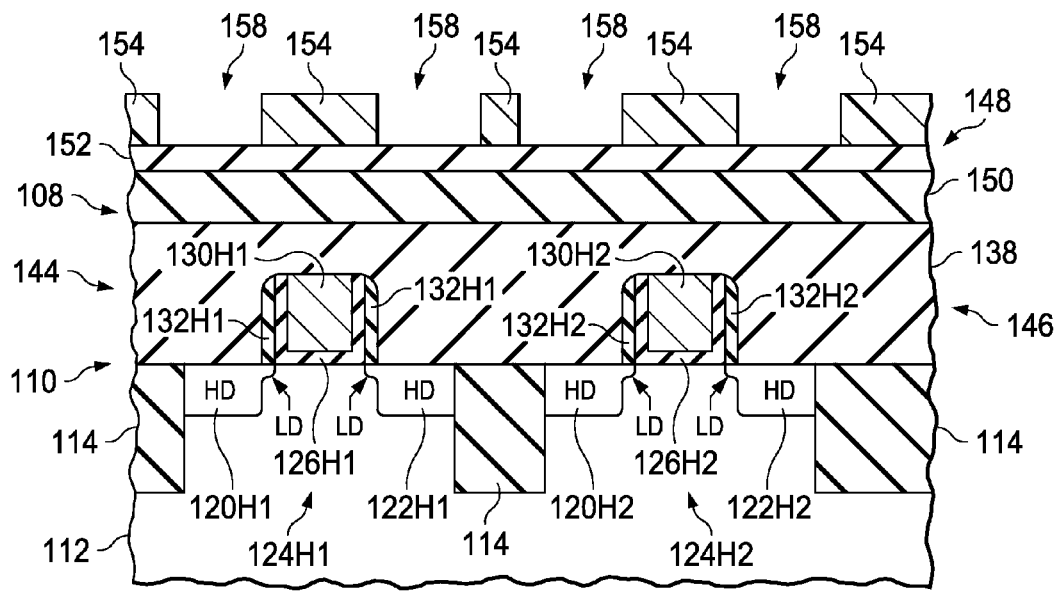
Figure 3A:
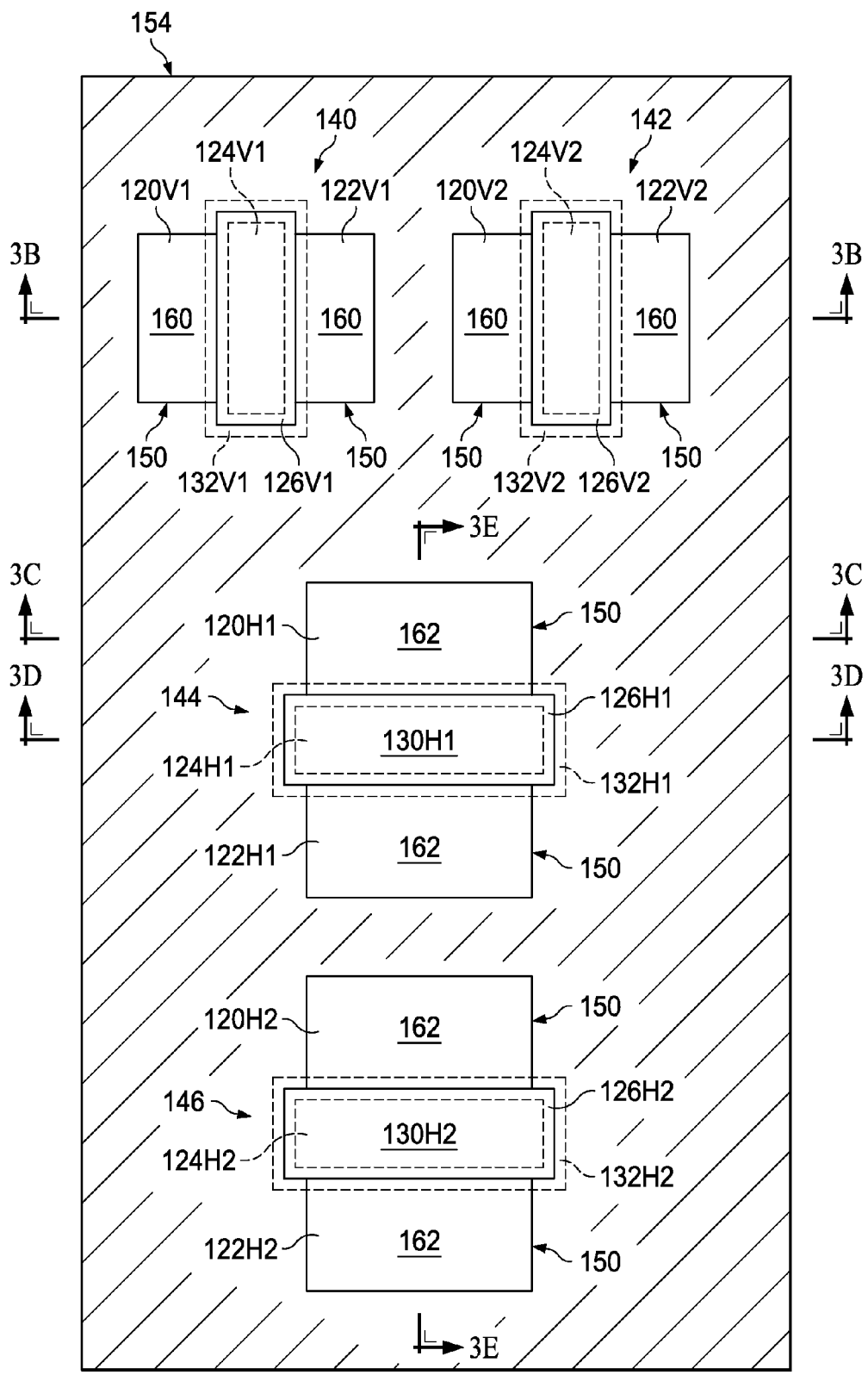
Figure 3B:
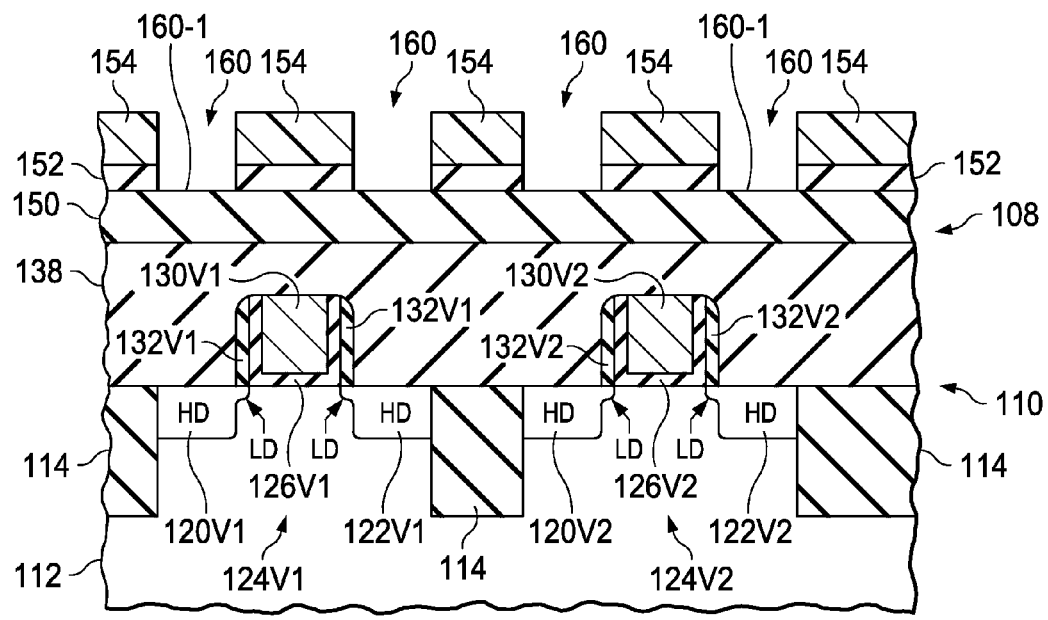
Figure 3C:
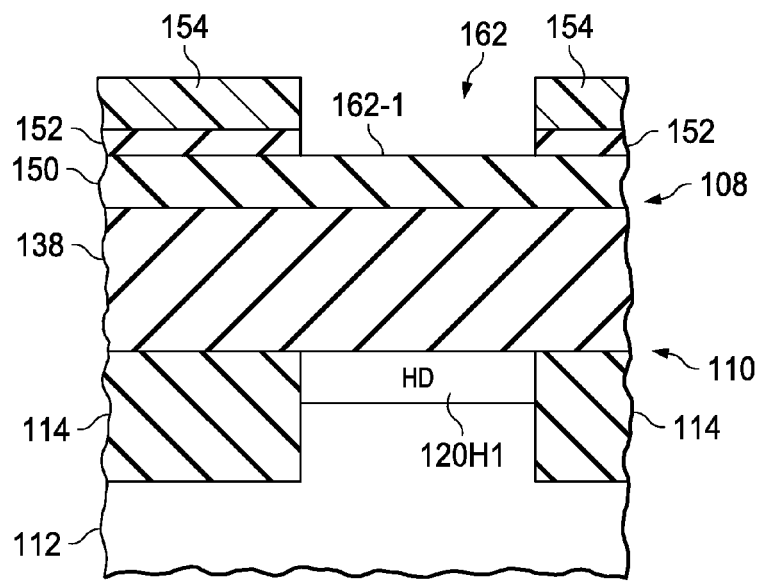
Figure 3D:
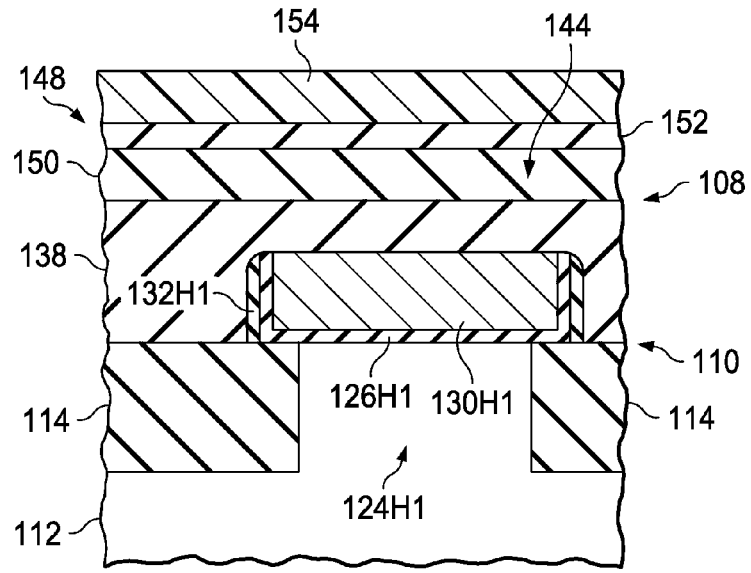
Figure 3E:
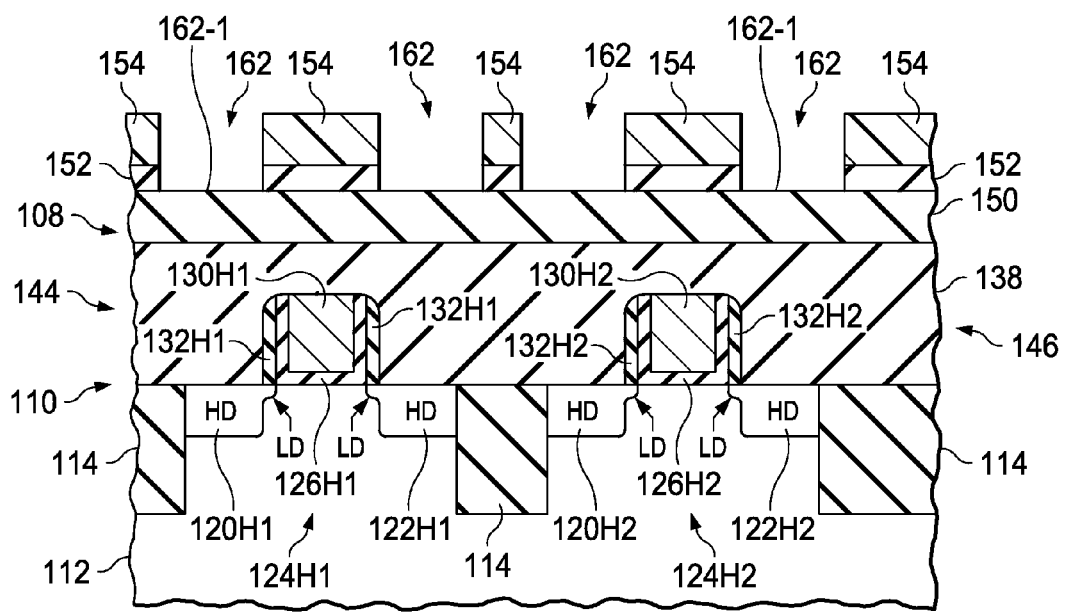
Figure 4A:
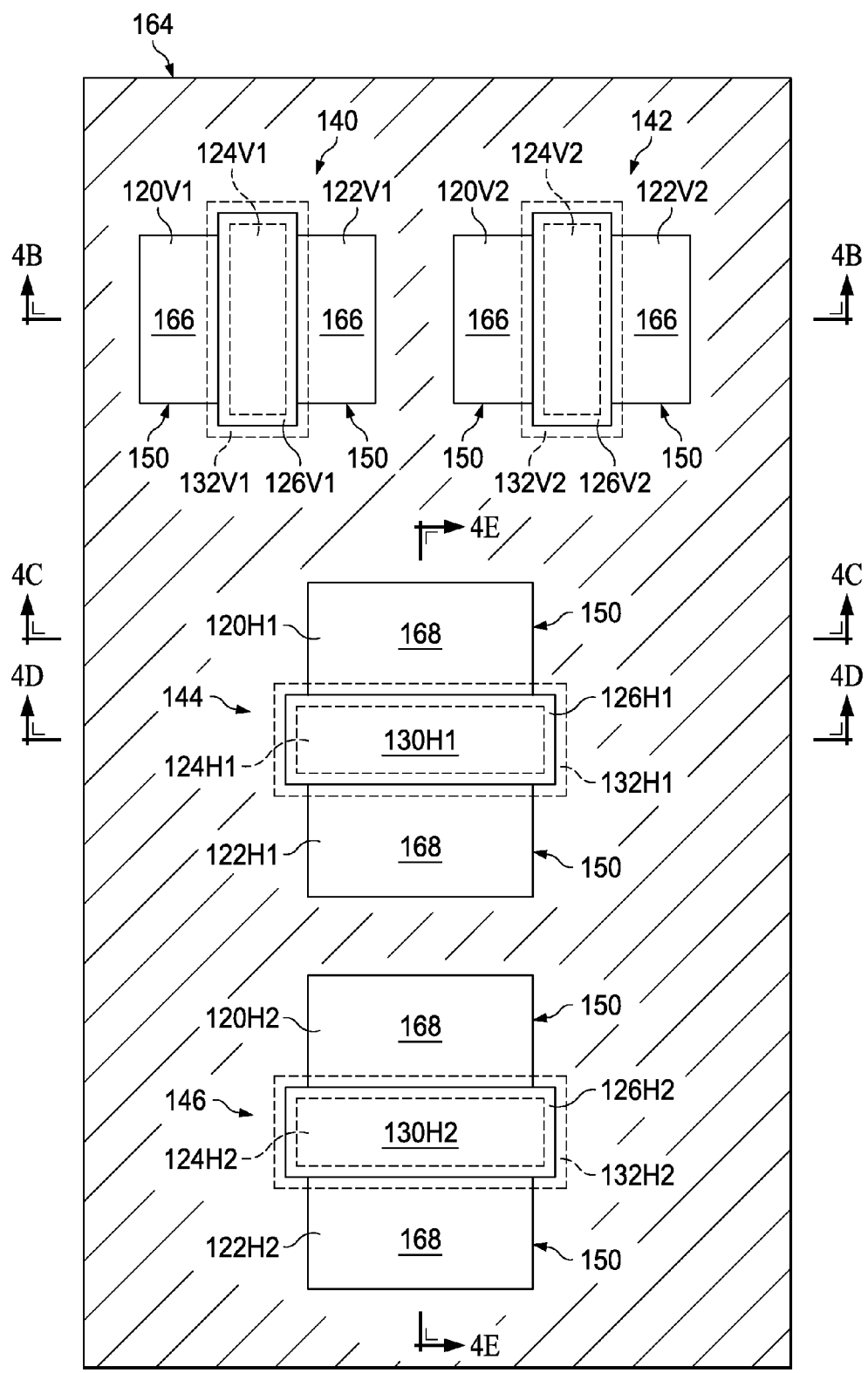
Figure 4B:
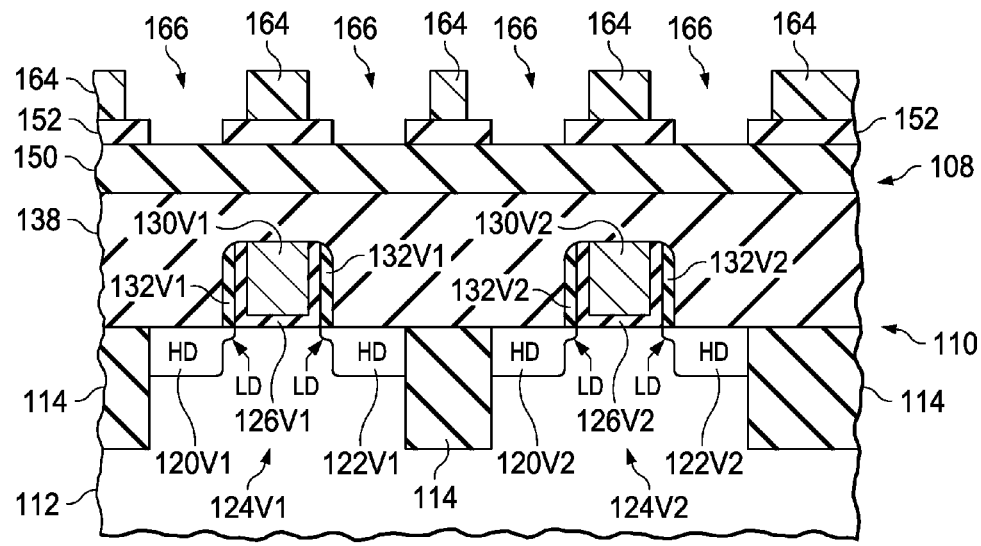
Figure 4C:
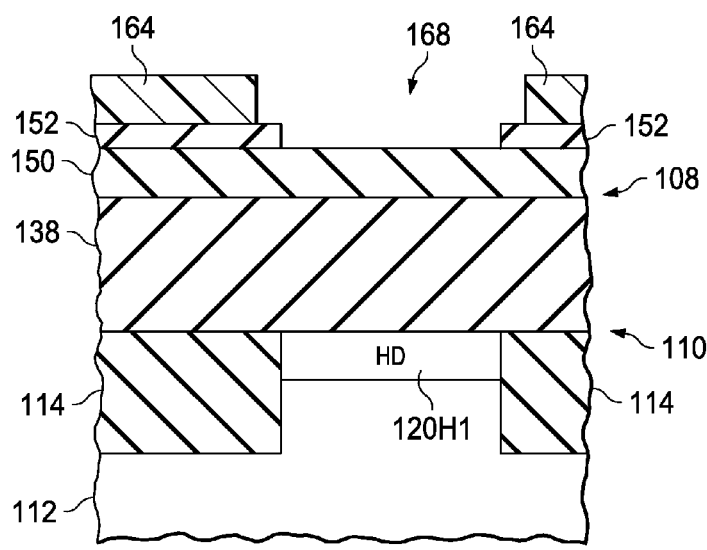
Figure 4D:
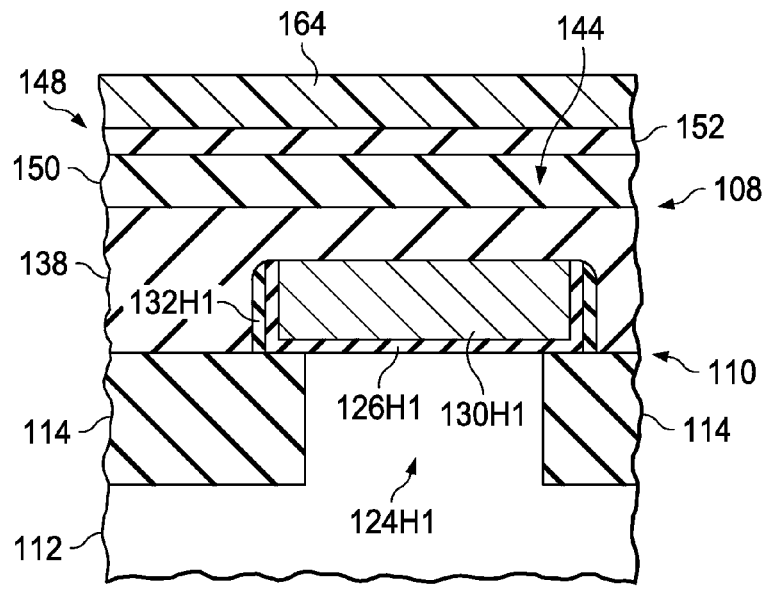
Figure 4E:
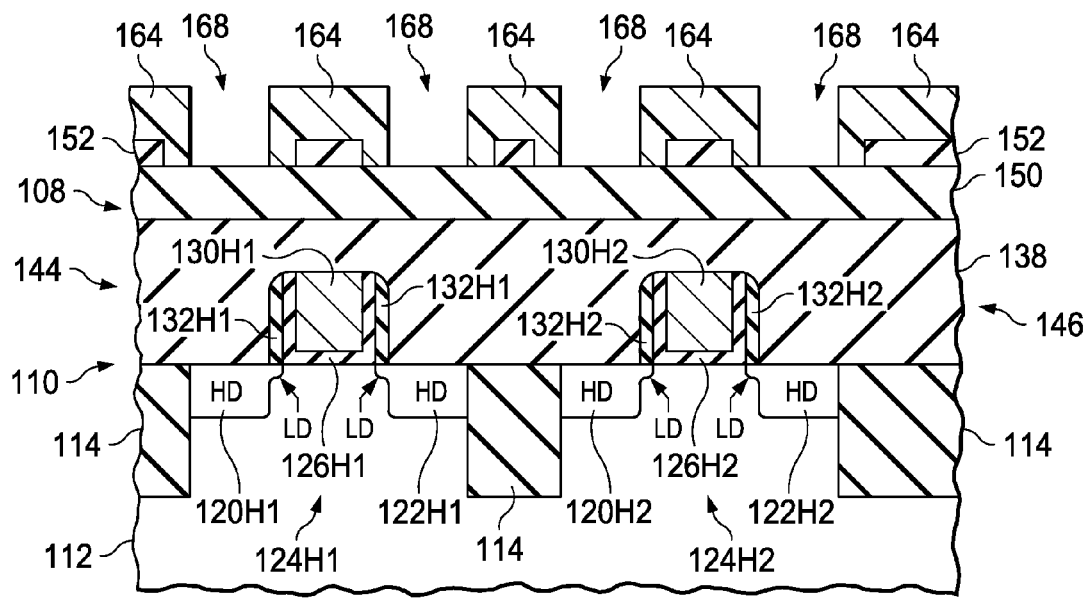
Figure 5A:
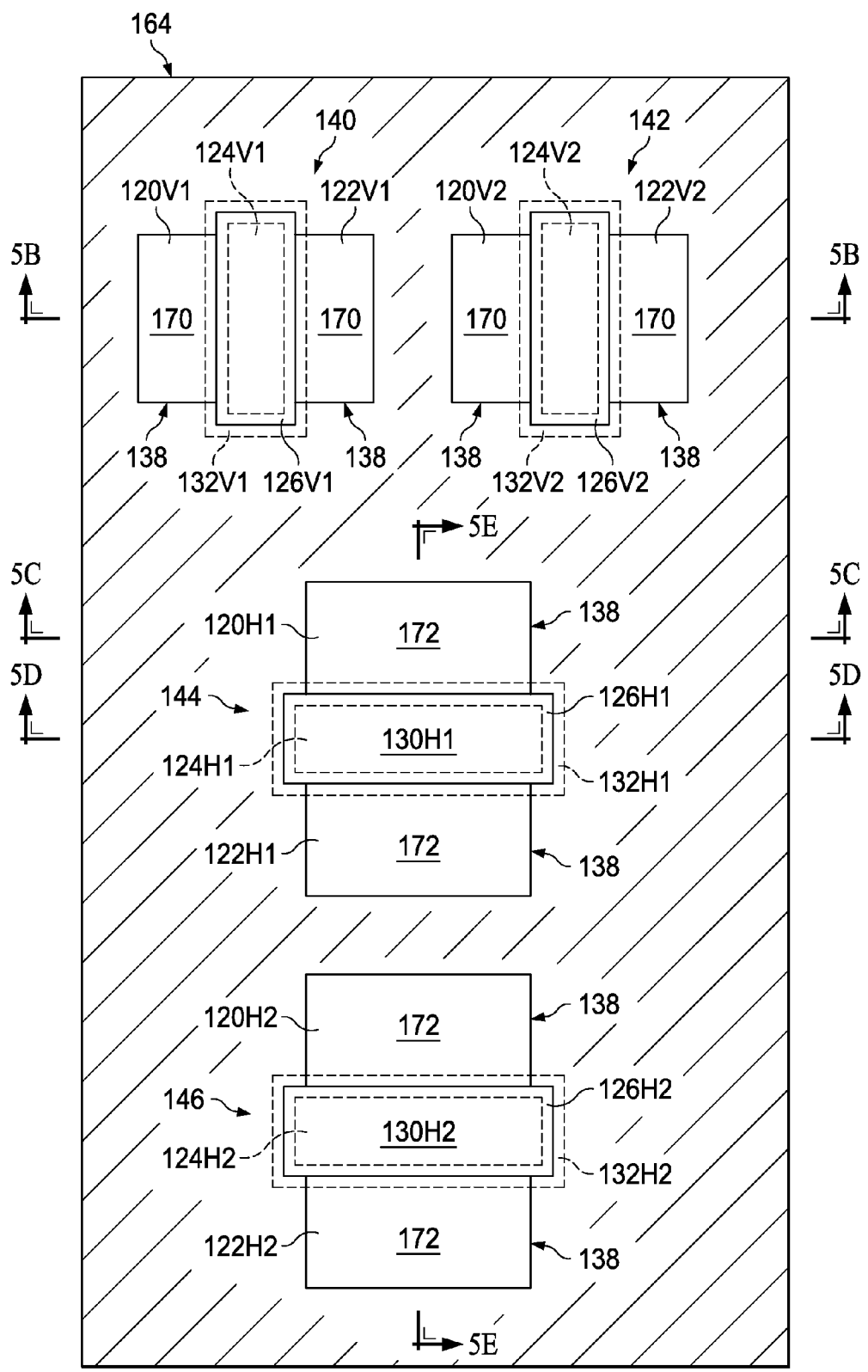
Figure 5B:
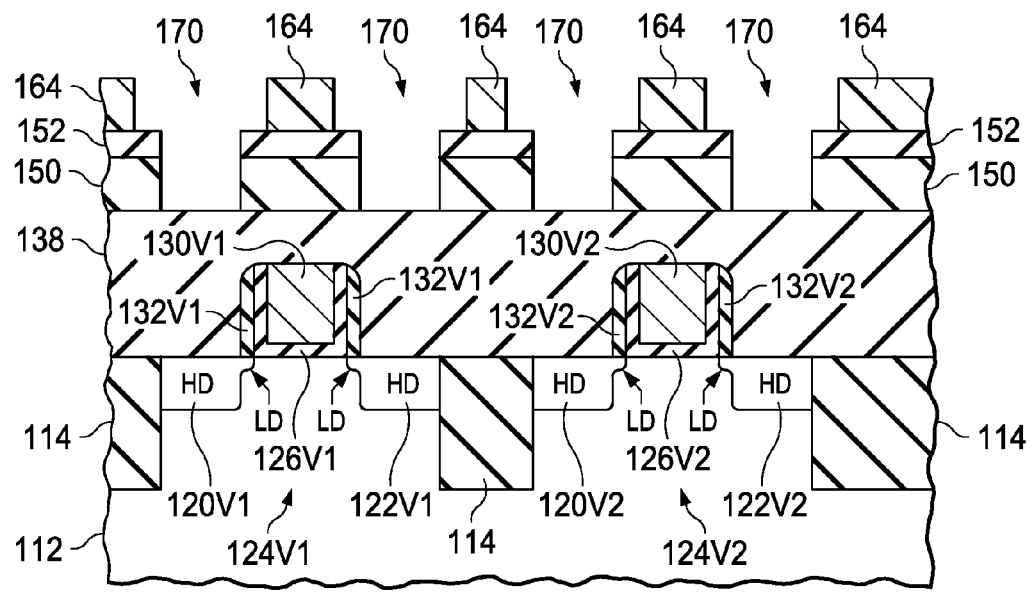
Figure 5C:
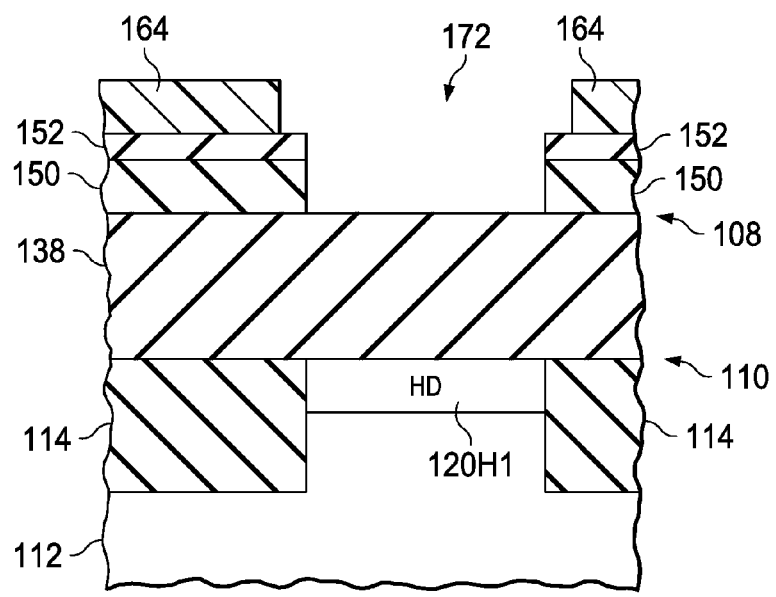
Figure 5D:
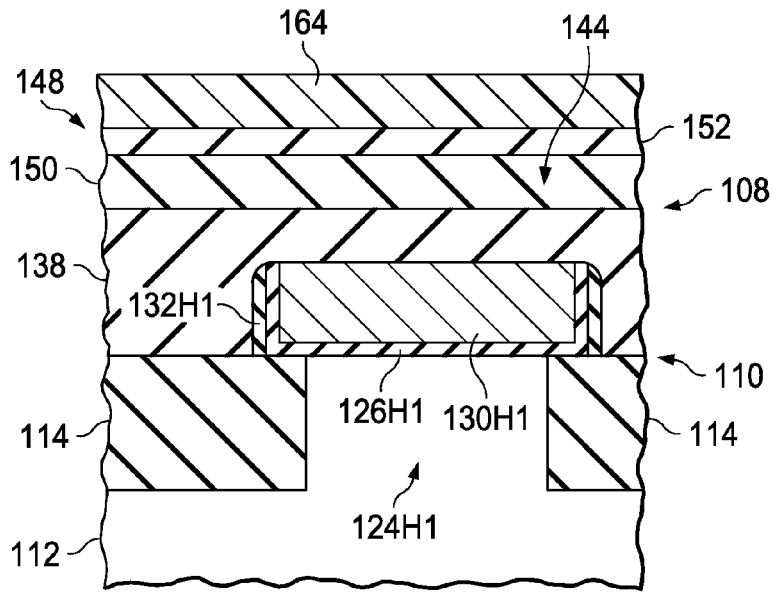
Figure 5E:
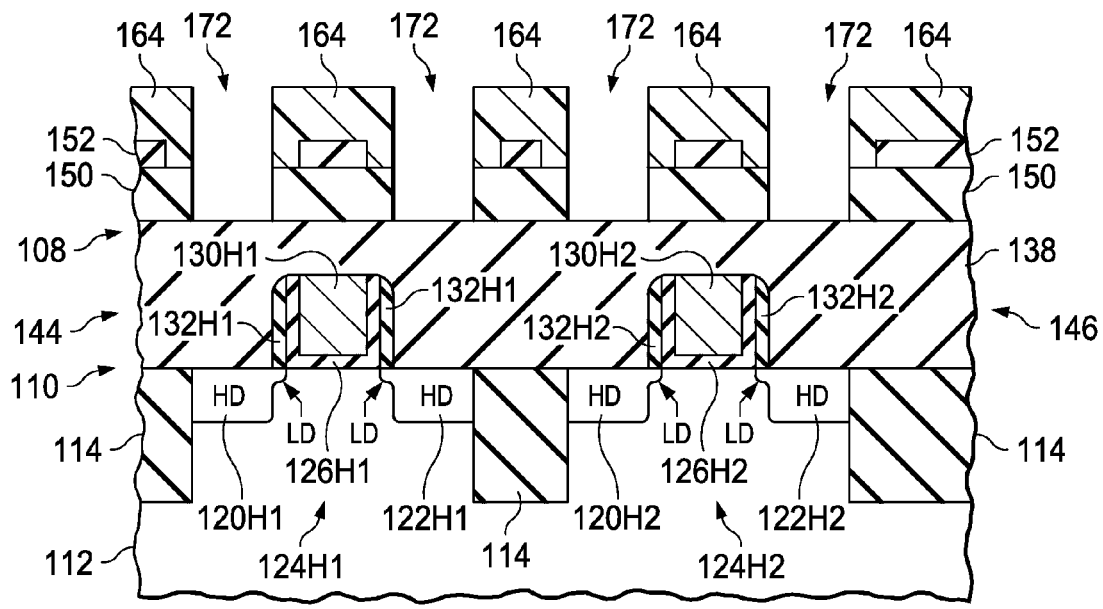
Figure 6A:
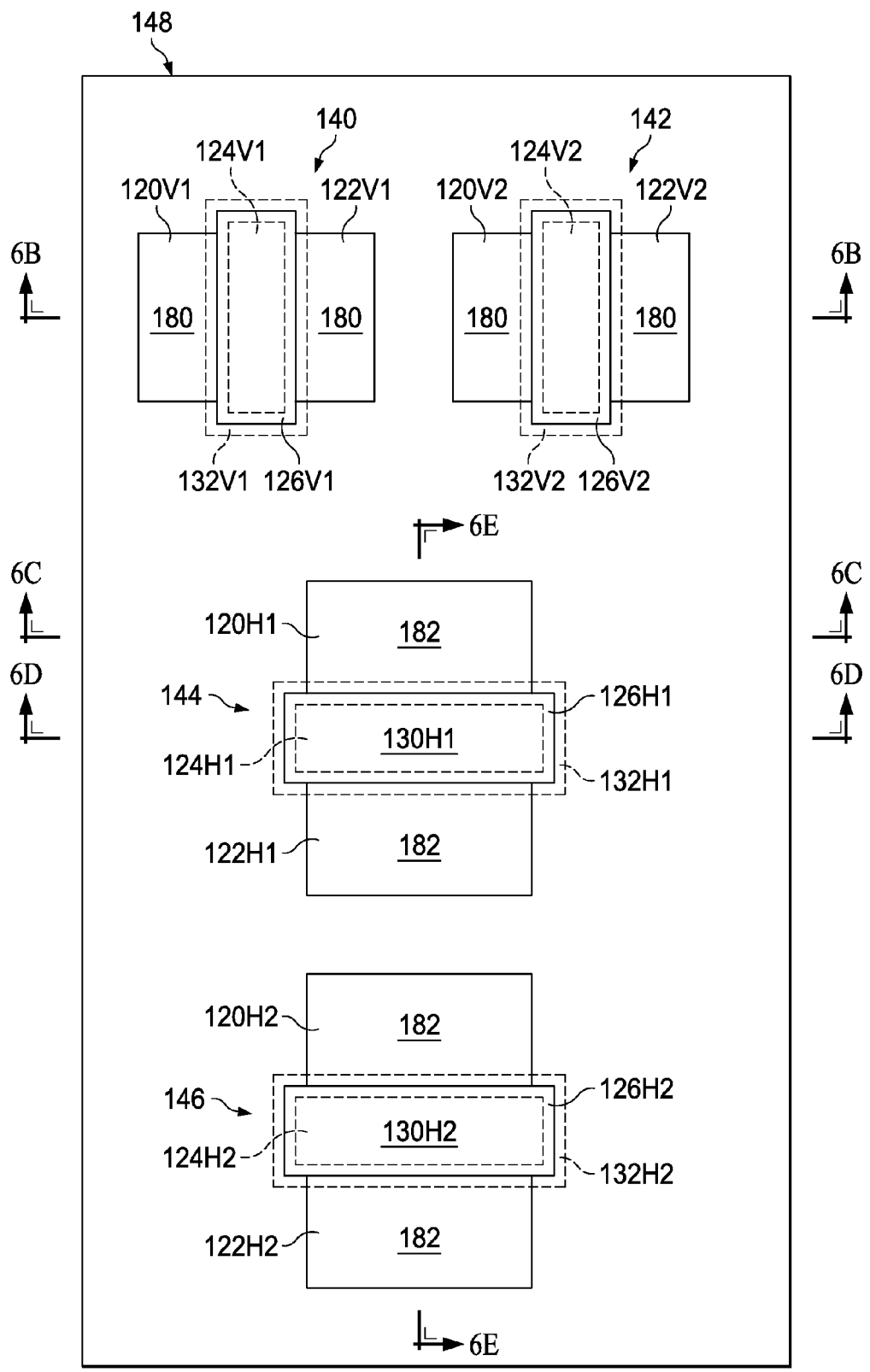
Figure 6B:
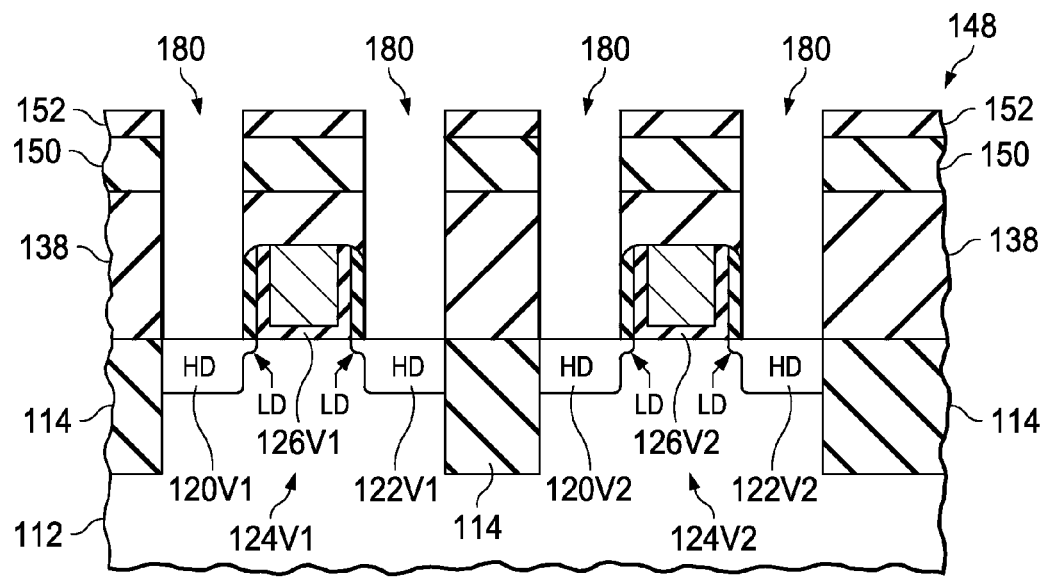
Figure 6C:
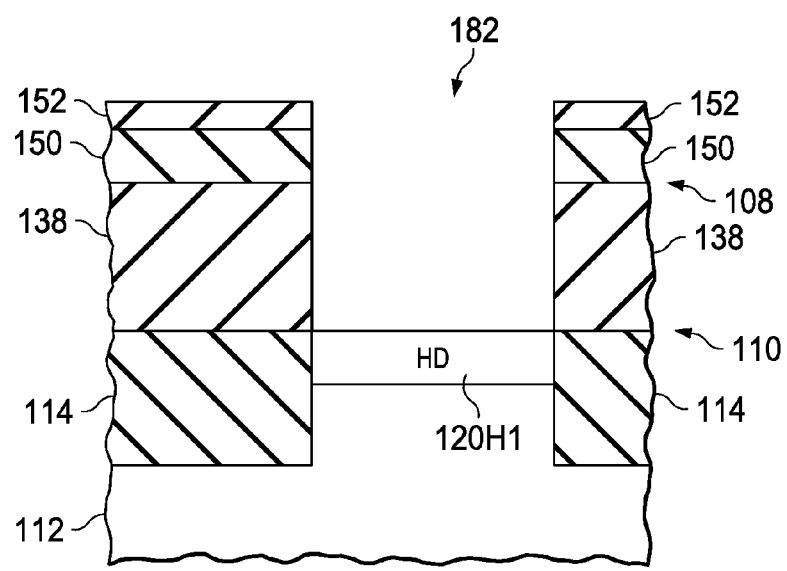
Figure 6D:
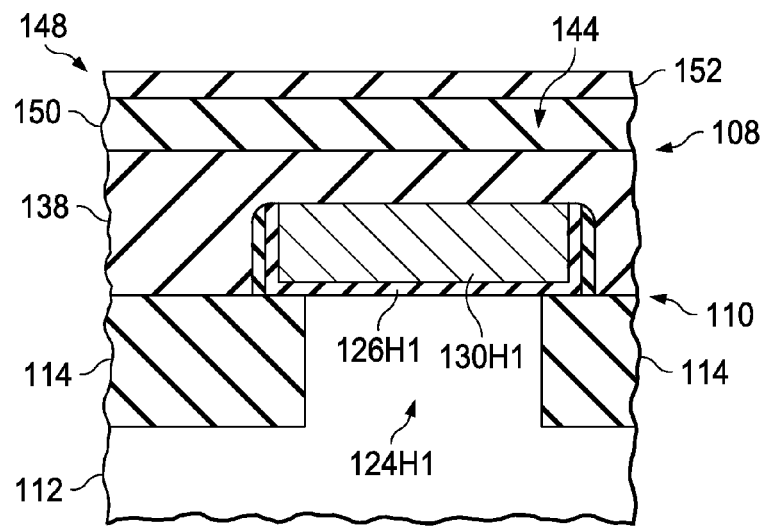
Figure 6E:
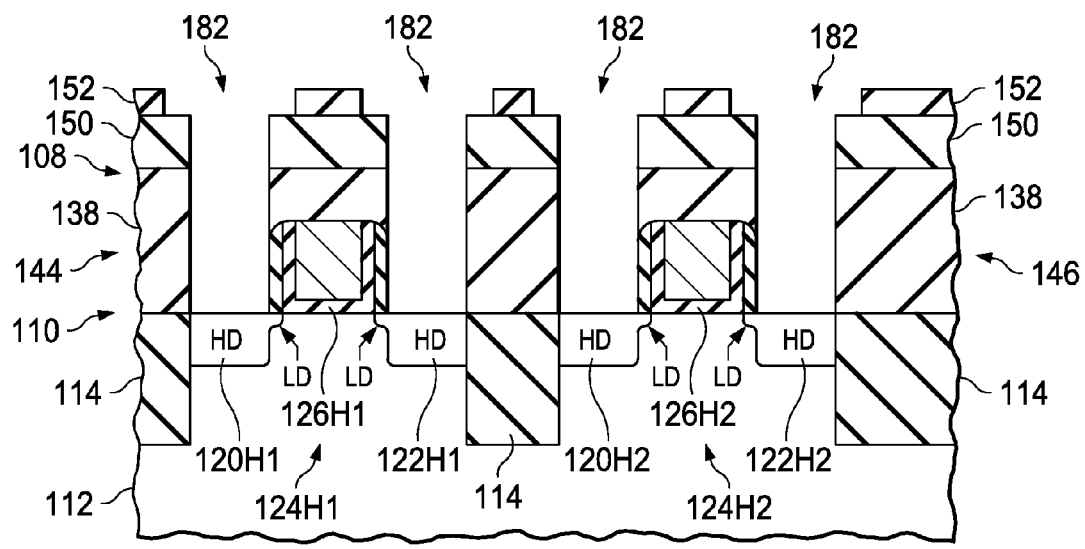
Figure 7A:
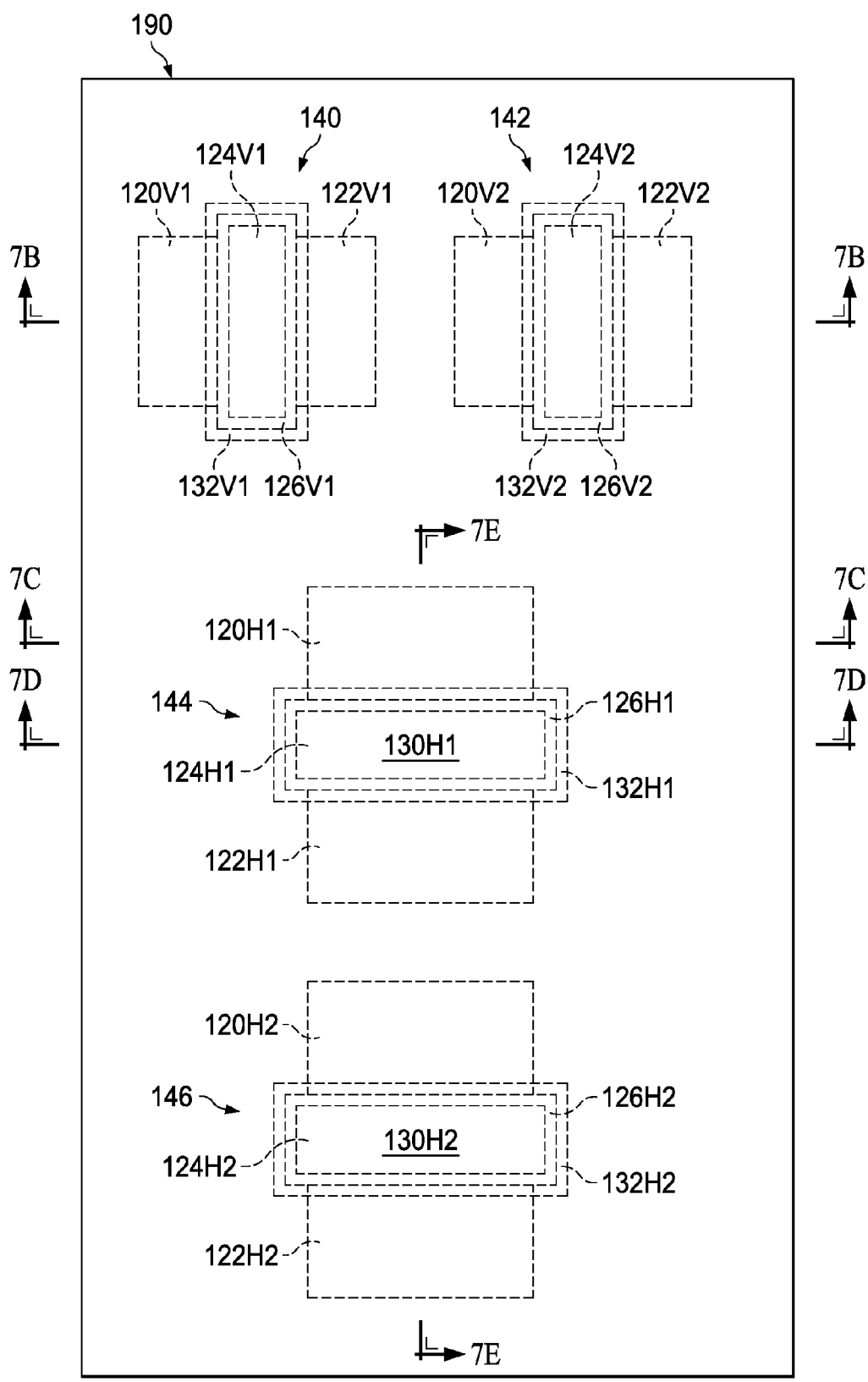
Figure 7B:
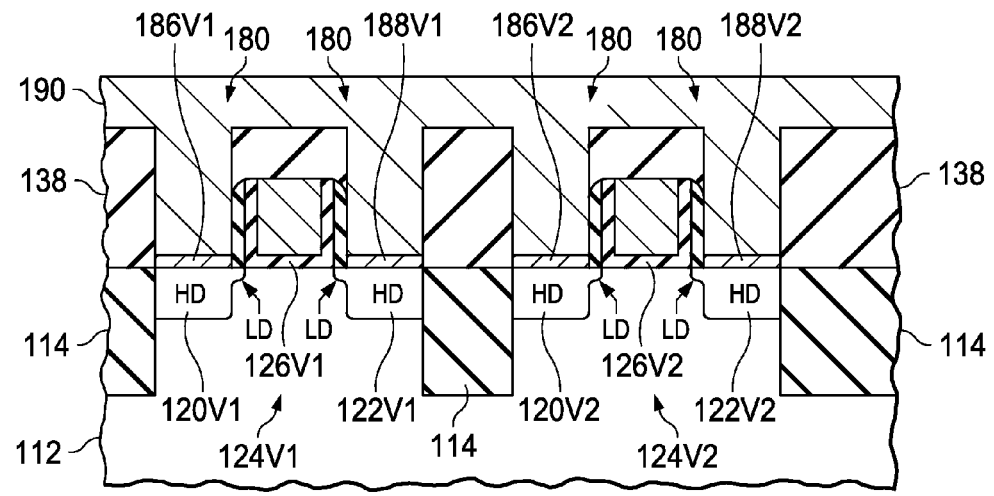
Figure 7C:
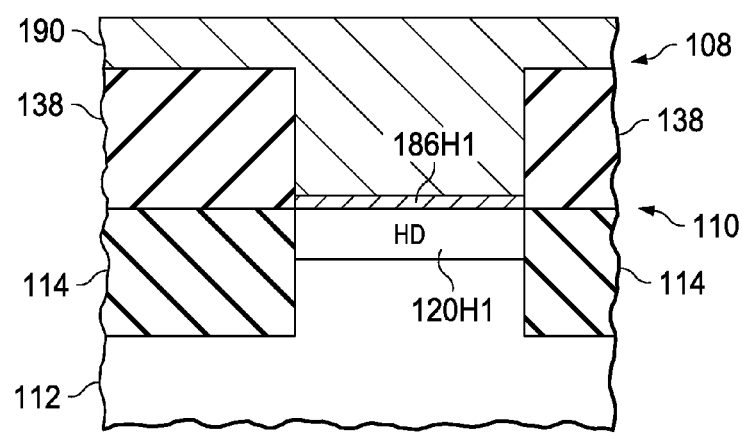
Figure 7D:
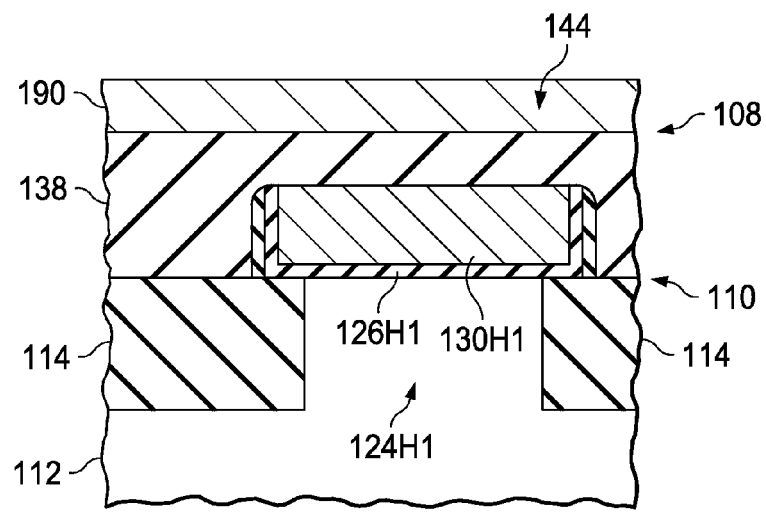
Figure 7E:
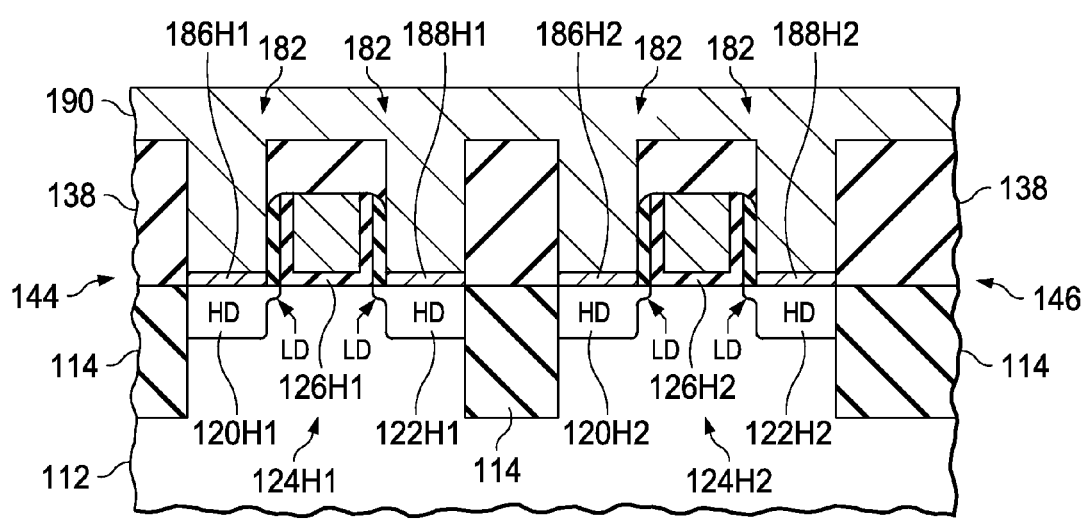
Figure 8A:
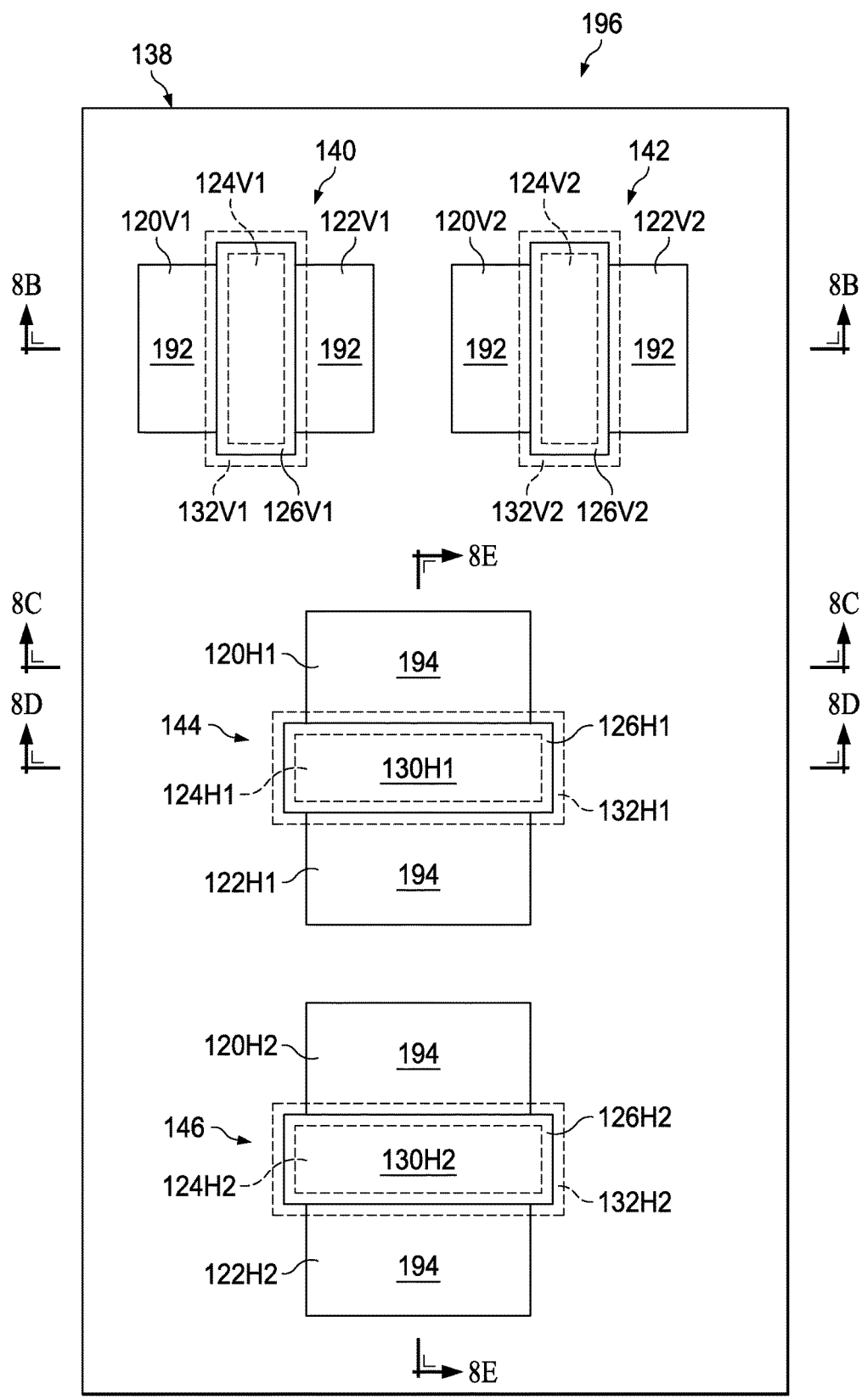
Figure 8B:
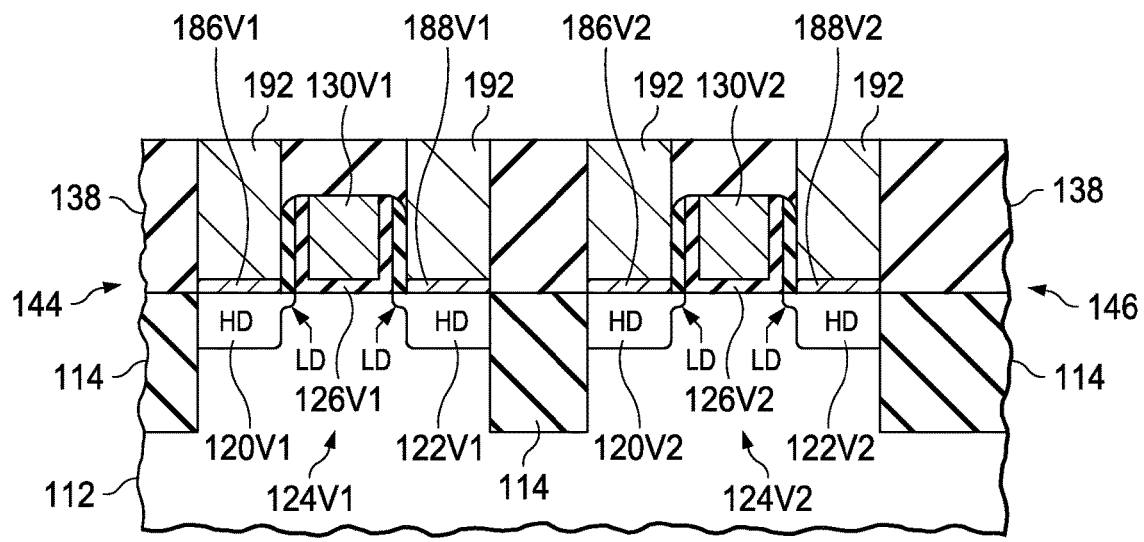
Figure 8C:
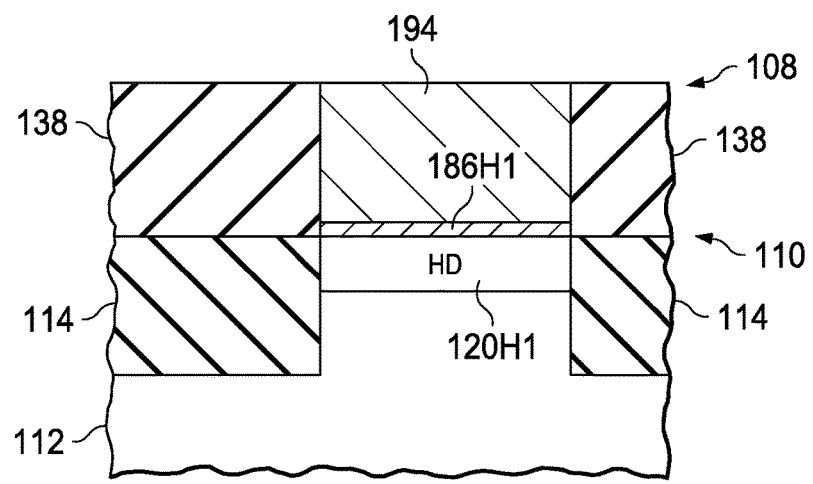
Figure 8D:
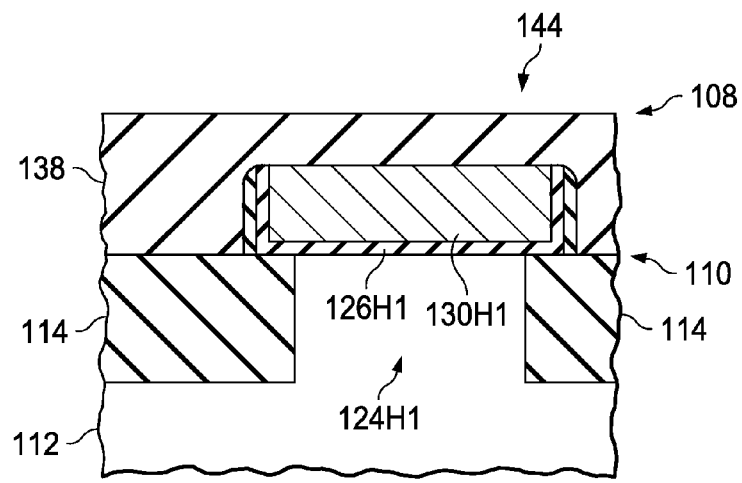
Figure 8E:
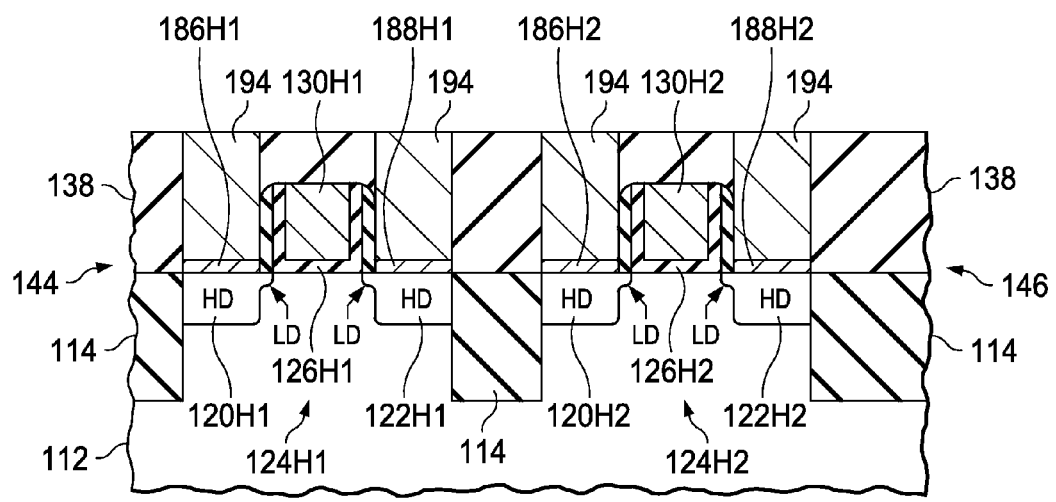

FIGS. 1A-1E through 8A-8E show views that illustrate an example of a method 100 of forming a MOS transistor structure with vertically and horizontally-elongated metal contacts in accordance with the present invention. FIGS. 1A-8A show plan views, while FIGS. 1B-8B show cross-sectional views taken along lines 1B-1B through 8B-8B of FIGS. 1A-8A, FIGS. 1C-8C show cross-sectional views taken along lines 1C-1C through 8C-8C of FIGS. 1A-8A, FIGS. 1D-8D show cross-sectional views taken along lines 1D-1D through 8D-8D of FIGS. 1A-8A, and FIGS. 1E-8E show cross-sectional views taken along lines 1E-1E through 8E-8E of FIGS. 1A-8A.

As shown in FIGS. 1A-1E, method 100 utilizes a conventionally-formed metal-gate MOS transistor structure 108. MOS transistor structure 108, in turn, includes a semiconductor body 110 that has a single-crystal-silicon substrate region 112, and a trench isolation structure 114 that touches substrate region 112.

In addition, semiconductor body 110 includes first and second vertically-elongated sources 120V1 and 120V2, and first and second vertically-elongated drains 122V1 and 122V2 that each touch substrate region 112. Semiconductor body 110 also includes first and second horizontally-elongated sources 120H1 and 120H2, and first and second horizontally-elongated drains 122H1 and 122H2 that each touch substrate region 112.

The sources 120V1, 120V2, 120H1, and 120H2 and the drains 122V1, 122V2, 122H1, and 122H2 each has a conductivity type that is the opposite of the conductivity type of substrate region 112. In addition, each of the sources 120V1, 120V2, 120H1, and 120H2 and the drains 122V1, 122V2, 122H1, and 122H2 has a lighter-doped region LD and a heavier-doped region HD.

Further, substrate region 112 has a vertically-elongated channel region 124V1 that lies between source 120V1 and drain 122V1, a vertically-elongated channel region 124V2 that lies between source 120V2 and drain 122V2, a horizontally-elongated channel region 124H1 that lies between source 120H1 and drain 122H1, and a horizontally-elongated channel region 124H2 that lies between source 120H2 and drain 122H2.

As also shown in FIGS. 1A-1E, MOS transistor structure 108 includes a vertically-elongated high-k gate dielectric structure 126V1 that touches and lies over channel region 124V1, and a vertically-elongated metal gate 130V1 that touches gate dielectric structure 126V1 and lies over channel region 124V1. MOS transistor structure 108 additionally includes a vertically-elongated high-k gate dielectric structure 126V2 that touches and lies over channel region 124V2, and a vertically-elongated metal gate 130V2 that touches gate dielectric structure 126V2 and lies over channel region 124V2.

MOS transistor structure 108 further includes a horizontally-elongated high-k gate dielectric structure 126H1 that touches and lies over channel region 124H1, and a horizontally-elongated metal gate 130H1 that touches gate dielectric structure 126H1 and lies over channel region 124H1. In addition, MOS transistor structure 108 includes a horizontally-elongated high-k gate dielectric structure 126H2 that touches and lies over channel region 124H2, and a horizontally-elongated metal gate 130H2 that touches gate dielectric structure 126H2 and lies over channel region 124H2.

In addition, MOS transistor structure 108 includes a sidewall spacer 132V1 that laterally surrounds gate 130V1, a sidewall spacer 132V2 that laterally surrounds gate 130V2, a sidewall spacer 132H1 that laterally surrounds gate 130H1, and a sidewall spacer 132H2 that laterally surrounds gate 130H2.

MOS transistor structure 108 further includes a bottom dielectric layer 138 that touches the sidewall spacers 132V1, 132V2, 132H1, and 132H2. Bottom dielectric layer 138 also touches and lies over the sources 120V1, 120V2, 120H1, and 120H2, the drains 122V1, 122V2, 122H1, and 122H2, and the metal gates 130V1, 130V2, 130H1, and 130H2.

Source 120V1, drain 122V1, channel region 124V1, high-k gate dielectric structure 126V1, and metal gate 130V1 form a first vertically-oriented MOS transistor 140, while source 120V2, drain 122V2, channel region 124V2, high-k gate dielectric structure 126V2, and metal gate 130V2 form a second vertically-oriented MOS transistor 142.

The vertically-oriented MOS transistors 140 and 142 illustrate an array of vertically-oriented MOS transistors. Although the present example illustrates the array of vertically-oriented MOS transistors with only one row and two columns, the array can include many vertically-adjacent rows of vertically-oriented MOS transistors, each with many columns of vertically-oriented MOS transistors.

In addition, source 120H1, drain 122H1, channel region 124H1, high-k gate dielectric structure 126H1, and metal gate 130H1 form a first horizontally-oriented MOS transistor 144, while source 120H2, drain 122H2, channel region 124H2, high-k gate dielectric structure 126H2, and metal gate 130H2 form a second horizontally-oriented MOS transistor 146.

The horizontally-oriented MOS transistors 144 and 146 illustrate an array of horizontally-oriented MOS transistors. Although the present example illustrates the array of horizontally-oriented MOS transistors with only two rows and one column, the array can include many vertically-adjacent rows of horizontally-oriented MOS transistors, each with many columns of horizontally-oriented MOS transistors.

The widths of the horizontally-elongated sources 120H1 and 120H2 are approximately 3-10× larger than the widths of the vertically-elongated sources 120V1 and 120V2. Similarly, the widths of the horizontally-elongated drains 122H1 and 122H2 are approximately 3-10× larger than the widths of the vertically-elongated drains 122V1 and 122V2. Further, the channel lengths (the shortest distance between a source and drain) of the horizontally-elongated channel regions 124H1 and 124H2 are approximately 3-10× larger than the channel lengths of the vertically-elongated channel regions 124V1 and 124V2.

As further shown in FIGS. 1A-1E, method 100 begins by forming a hard mask 148 in a conventional manner to touch and lie over bottom dielectric layer 138. In the present example, hard mask 148 is implemented with an oxide layer 150 and a nitride layer 152 that touches and lies over oxide layer 150.

As shown in FIGS. 2A-2E, after hard mask 148 has been formed, a first patterned photoresist layer 154 is formed on hard mask 148. First patterned photoresist layer 154 has a number of vertically-elongated or slotted openings 156 that expose the top surface of hard mask 148, and lie directly vertically over the vertically-elongated sources 120V1 and 120V2 and the vertically-elongated drains 122V1 and 122V2.

In addition, first patterned photoresist layer 154 has a number of horizontally-elongated or slotted openings 158 that expose the top surface of hard mask 148, and lie directly vertically over the horizontally-elongated sources 120H1 and 120H2 and the horizontally-elongated drains 122H1 and 122H2.

Pitch is the distance from one edge of a feature to a corresponding edge of an adjacent feature. The minimum pitch is equal to $2(Ki)*(\lambda/NA)$, where Ki represents the difficulty of the lithographic process (the resolving capability), $\lambda$ represents the wavelength of the imaging light, and NA represents the numerical aperture of the lens.

Thus, using a current-generation imaging light with a wavelength of 193 nm and a lens with a numerical aperture of 1.35 (using water immersion), a minimum pitch of approximately 80 nm can be achieved when the minimum Ki approaches its practical limit of approximately 0.28. In the present example, the widths of the vertically-elongated openings 156 are approximately 20 nm, one-quarter of the minimum pitch of 80 nm. Further in the present example, the widths of the horizontally-elongated openings 158 are approximately 60-200 nm.

First patterned photoresist layer 154 is formed by depositing a layer of photoresist, projecting an imaging light onto the layer of photoresist through a patterned black/clear glass plate known as a mask to form a patterned image on the layer of photoresist, and removing the imaged photoresist regions, which were softened by exposure to the imaging light. First patterned photoresist layer 154 can also include an underlying anti-reflective coating.

In the present example, the imaging light projected through the mask to form the patterned image has a strong dipole component in the vertical direction. For example, two off-axis dipole emitting regions provide a strong dipole component. A light with a strong dipole component provides feature sizes that are as small as can be accurately formed in the direction of the strong dipole component, and feature sizes that are as small as can be accurately formed in a direction orthogonal to the strong dipole component, but which are still larger (e.g., 3-10× larger) than the minimum feature sizes formed in the direction of the strong dipole component.

Thus, the vertically-elongated openings 156 in patterned photoresist layer 154, which are aligned with the direction of the strong dipole component, can be formed with first minimum widths that are as small as can be accurately formed, while at the same time the horizontally-elongated openings 158, which are aligned with a direction orthogonal to the direction of the strong dipole component, can be formed in patterned photoresist layer 154 with second minimum widths that are as small as can be accurately formed, but which are still larger (e.g., 3-10× larger) than the first minimum widths.

As shown in FIGS. 3A-3E, after first patterned photoresist layer 154 has been formed, the uncovered regions on the top surface of hard mask 148 are etched to form a number of vertically-elongated or slotted openings 160 in hard mask 148 that lie directly vertically over the vertically-elongated sources 120V1 and 120V2 and the vertically-elongated drains 122V1 and 122V2. The bottom surfaces 160-1 of the vertically-elongated or slotted openings 160 are vertically spaced apart from the top surface of bottom dielectric layer 138.

In addition, the etch also forms a number of horizontally-elongated or slotted openings 162 in hard mask 148 that lie directly vertically over the horizontally-elongated sources 120H1 and 120H2 and the horizontally-elongated drains 122H1 and 122H2. The bottom surfaces 162-1 of the horizontally-elongated or slotted openings 162 are also vertically spaced apart from the top surface of bottom dielectric layer 138.

In the present example, the openings 160 and 162 extend through nitride layer 152 and expose oxide layer 150. Further in the present example, the widths of the vertically-elongated openings 160 are approximately 20 nm, while the widths of the horizontally-elongated openings 162 are approximately 60-200 nm. Following this, patterned photoresist layer 154 is removed in a conventional manner, such as with an ash process.

As shown in FIGS. 4A-4E, after patterned photoresist layer 154 has been removed, a second patterned photoresist layer 164 is formed on hard mask 148. Second patterned photoresist layer 164 can also include an underlying anti-reflective coating. Second patterned photoresist layer 164 has a number of vertically-elongated or slotted openings 166 that expose the vertically-elongated openings 160 in hard mask 148, and lie directly vertically over the vertically-elongated sources 120V1 and 120V2 and the vertically-elongated drains 122V1 and 122V2. In the present example, the vertically-elongated or slotted openings 166 expose the top surface of oxide layer 150.

In addition, second patterned photoresist layer 164 has a number of horizontally-elongated or slotted openings 168 that expose the horizontally-elongated openings 162 in hard mask 148, and lie directly vertically over the horizontally-elongated sources 120H1 and 120H2 and the horizontally-elongated drains 122H1 and 122H2. In the present example, the horizontally-elongated or slotted openings 168 expose the top surface of oxide layer 150.

Second patterned photoresist layer 164 is formed by depositing a layer of photoresist, projecting an imaging light onto the layer of photoresist through a patterned black/clear glass plate known as a mask to form a patterned image on the layer of photoresist, and removing the imaged photoresist regions, which were softened by exposure to the imaging light. Second patterned photoresist layer 164 can also include an underlying anti-reflective coating.

In the present example, the imaging light projected through the mask to form the patterned image has a strong dipole component in the horizontal direction. For example, two off-axis dipole emitting regions provide a strong dipole component. As noted above, a light with a strong dipole component provides feature sizes that are as small as can be accurately formed in the direction of the strong dipole component, and feature sizes that are as small as can be accurately formed in a direction orthogonal to the strong dipole component, but which are still larger (e.g., 3-10× larger) than the minimum feature sizes formed in the direction of the strong dipole component.

Thus, the horizontally-elongated openings 168 in patterned photoresist layer 164, which are aligned with the direction of the strong dipole component, could be formed with first minimum widths that are as small as can be accurately formed, while at the same time the vertically-elongated openings 156, which are aligned with a direction orthogonal to the direction of the strong dipole component, could be formed in patterned photoresist layer 154 with second minimum widths that are as small as can be accurately formed, but which are still larger (e.g., 3-10× larger) than the first minimum widths.

Although the horizontally-elongated openings 168 could be formed with first minimum widths that are as small as can be accurately formed, the horizontally-elongated openings 168 are instead formed to have relaxed widths (e.g., approximately equal to the second minimum widths) which are accurately defined. In the present example, the relaxed widths can be from 60 nm to 200 nm. In addition, although the vertically-elongated openings 166 could be formed with second minimum widths, the vertically-elongated openings 166 are also formed to have relaxed widths which are accurately defined.

As shown in FIGS. 5A-5E, after second patterned photoresist layer 164 has been formed, the uncovered regions of hard mask 148 are etched to form a number of vertically-elongated or slotted openings 170 in hard mask 148 that expose the top surface of bottom dielectric layer 138, and lie directly vertically over the vertically-elongated sources 120V1 and 120V2 and the vertically-elongated drains 122V1 and 122V2.

In addition, the etch also forms a number of horizontally-elongated or slotted openings 172 in hard mask 148 that expose the top surface of bottom dielectric layer 138, and lie directly vertically over the horizontally-elongated sources 120H1 and 120H2 and the horizontally-elongated drains 122H1 and 122H2. In the present example, the widths of the horizontally-elongated openings 172 are approximately 60-200 nm. Following this, patterned photoresist layer 164 is removed in a conventional manner, such as with an ash process.

As shown in FIGS. 6A-6E, after patterned photoresist layer 164 has been removed, the uncovered regions on the top surface of bottom dielectric layer 138 are etched. The etch forms a number of vertically-elongated metal contact openings 180 in bottom dielectric layer 138 that expose substantially all of the top surfaces of the heavily-doped regions HD of the vertically-elongated source regions 120V1 and 120V2 and substantially all of the top surfaces of the heavily-doped regions HD of the vertically-elongated drain regions 122V1 and 122V2.

The etch also forms a number of horizontally-elongated metal contact openings 182 in bottom dielectric layer 138 that expose substantially all of the top surfaces of the heavily-doped regions HD of the horizontally-elongated source regions 120H1 and 120H2 and substantially all of the top surfaces of the heavily-doped regions HD of the horizontally-elongated drain regions 122H1 and 122H2.

In the present example, the vertically-elongated metal contact openings 180 each have widths of approximately 20 nm due to the widths of the hard mask openings 170, while the horizontally-elongated metal contact openings 182 each have widths of approximately 60-200 nm due to the widths of the hard mask openings 172. After the metal contact openings 180 and 182 have been formed, the remaining portion of hard mask 148 is removed in a conventional manner.

As shown in FIGS. 7A-7E, once hard mask 148 has been removed, a source metal silicide region 186V1 is conventionally formed to touch and lie over source region 120V1, a source metal silicide region 186V2 is conventionally formed to touch and lie over source region 120V2, a source metal silicide region 186H1 is conventionally formed to touch and lie over source region 120H1, and a source metal silicide region 186H2 is conventionally formed to touch and lie over source region 120H2.

Further, a drain metal silicide region 188V1 is conventionally formed to touch and lie over drain region 122V1, a drain metal silicide region 188V2 is conventionally formed to touch and lie over drain region 122V2, a drain metal silicide region 188H1 is conventionally formed to touch and lie over drain region 122H1, and a drain metal silicide region 188H2 is conventionally formed to touch and lie over drain region 122H2.

After the source metal silicide regions 186V1, 186V2, 186H1, and 186H2 and the drain metal silicide regions 188V1, 188V2, 188H1, and 188H2 have been formed, a metal contact layer 190, such as a layer of tungsten (W), is deposited to touch the top surface of bottom dielectric layer 138 and fill up the metal contact openings 180 and 182 in bottom dielectric layer 138.

As shown in FIGS. 8A-8E, after metal contact layer 190 has been formed, metal contact layer 190 is planarized in a conventional manner, such as with chemical-mechanical polishing, to expose the top surface of bottom dielectric layer 138. The planarization forms vertically-elongated metal contacts 192 in the metal contact openings 180 and horizontally-elongated metal contacts 194 in the metal contact openings 182.

The vertically-elongated metal contacts 192 make electrical connections to the source metal silicide regions 186V1 and 186V2, and the drain metal silicide regions 188V1 and 188V2. The horizontally-elongated metal contacts 194 make electrical connections to the source metal silicide regions 186H1 and 186H2, and the drain metal silicide regions 188H1 and 188H2.

Each of the above-described vertically-elongated structures has a longitudinal axis that lies in the vertical direction, while each of the above-described horizontally-elongated structures has a longitudinal axis that lies in the horizontal direction. Method 100 then continues with conventional steps to complete the formation of a metal interconnect structure.

Thus, the present invention forms a semiconductor structure 196 that includes rows and columns of first MOS transistors 140 and 142, where the first MOS transistors 140 and 142 have elongated source regions 120V1 and 120V2 and elongated drain regions 122V1 and 122V2 with longitudinal axes that lie in a first direction.

Semiconductor structure 196 also includes rows and columns of second MOS transistors 144 and 146, where the second MOS transistors 144 and 146 have elongated source regions 120H1 and 120H2 and elongated drain regions 122H1 and 122H2 with longitudinal axes that lie in a second direction that is substantially orthogonal to the first direction. Further, the semiconductor structure includes a dielectric layer 138 that touches and lies over the first and second MOS transistors 140, 142, 144, and 146.

In addition, semiconductor structure 196 includes a first number of vertically-elongated metal contacts 192 and a second number of horizontally-elongated metal contacts that extend through dielectric layer 138. The vertically-elongated metal contacts 192 have longitudinal axes that lie in the first direction, have first widths, and make electrical connections to the vertically-elongated source regions 120V1 and 120V2 and the vertically-elongated drain regions 122V1 and 122V2.

The horizontally-elongated metal contacts 194 have longitudinal axes that lie in the second direction, have second widths substantially larger than the first widths, and make electrical connections to the horizontally-elongated source regions 120H1 and 120H2 and the horizontally-elongated drain regions 122H1 and 122H2.

One of the advantages of the present invention is that both the vertically-elongated metal contacts and the horizontally-elongated metal contacts can be formed with the highest photolithographic accuracy. The first photoresist mask indirectly defines the widths of the vertically-elongated metal contacts and the lengths of the horizontally-elongated metal contacts with the highest photolithographic accuracy, and the second photoresist mask indirectly defines the lengths of the vertically-elongated metal contacts and the widths of the horizontally-elongated metal contacts with the highest photolithographic accuracy.

Another advantage of the present invention is that the vertically-elongated metal contact openings 180 expose substantially all of the top surfaces of the source and drain metal silicide regions 186V1, 186V2, 188V1, and 188V2, while the horizontally-elongated metal contact openings 182 expose substantially all of the top surfaces of the source and drain metal silicide regions 186H1, 186H2, 188H1, and 188H2. As a result, the present invention provides a method of reducing the contact resistance when compared to square metal contacts because of the greater surface area.

It should be understood that the above descriptions are examples of the present invention, and that various alternatives of the invention described herein may be employed in practicing the invention. For example, although the method of present invention has been described in terms of vertically and horizontally-oriented MOS transistors, the method of the present invention applies to any two groups of MOS transistors where the orientation of the first group is substantially orthogonal to the orientation of the second group. Thus, it is intended that the following claims define the scope of the invention and that structures and methods within the scope of these claims and their equivalents be covered thereby.

What is claimed is:

1. A method of forming a semiconductor structure comprising:
    forming a hard mask that touches and lies over a dielectric layer, the dielectric layer having a top surface;
    etching the hard mask to form a first elongated opening and a second elongated opening, the first elongated opening having a depth, a length extending in a first direction and a width extending in a second direction, the length being larger than the width and the second elongated opening having a depth, a length extending in the second direction and a width extending in the first direction, the length being larger than the width, first elongated opening having a bottom surface that lies above and spaced apart from the top surface of the dielectric layer, the second elongated opening having a bottom surface that lies above and spaced apart from the top surface of the dielectric layer, the second direction being substantially orthogonal to the first direction; and
    etching the hard mask to form a third elongated opening and a fourth elongated opening after the first elongated opening and the second elongated opening have been formed, the third elongated opening exposing a first region on the top surface of the dielectric layer, and having a length larger than a width wherein the length extends in the first direction, the fourth elongated opening exposing a second region on the top surface of the dielectric layer, and having a length larger than a width wherein the length extends in the second direction.

2. The method of claim 1 wherein:
    the hard mask includes a first material and a second material that touches and lies over the first material, the second material being different from the first material; and
    the first and second elongated openings each extends through the second material to expose a region of the first material.

3. The method of claim 1 and further comprising etching the first region and the second region on the top surface of the dielectric layer to form a first elongated metal contact opening and a second elongated metal contact opening,
    the first elongated metal contact opening having a length larger than a width wherein the length extends in the first direction, and exposing a first elongated source region that has a longitudinal axis lying in the first direction,
    the second elongated metal contact opening having a length larger than a width wherein the length extends in the second direction, and exposing a second elongated source region that has a longitudinal axis lying in the second direction.

4. The method of claim 3 wherein the width of the first elongated metal contact opening is substantially smaller than the width of the second elongated metal contact opening.

5. The method of claim 3 and further comprising forming a first elongated source silicide layer on the first elongated source region, and a second elongated source silicide layer on the second elongated source region.

6. The method of claim 5 and further comprising forming a first elongated metal contact on the first elongated source silicide layer, and a second elongated metal contact on the second elongated source silicide layer.

7. The method of claim 6 wherein the first elongated metal contact has a length larger than a width wherein the length extends in the first direction, and the second elongated metal contact has a length larger than a width wherein the length extends in the second direction.

8. The method of claim 7 wherein the width of the first elongated metal contact is substantially smaller than the width of the second elongated metal contact.

9. The method of claim 1 and further comprising forming a first patterned photoresist layer on the hard mask before the first and second elongated openings are formed, the first patterned photoresist layer defining the first and second elongated openings, the forming a first patterned photoresist layer including projecting a first imaging light onto a photoresist layer, the first imaging light having a strong dipole component in the first direction.

10. The method of claim 9 and further comprising forming a second patterned photoresist layer on the hard mask before the third and fourth elongated openings are formed, the second patterned photoresist layer defining the third and fourth elongated openings, the forming a second patterned photoresist layer including projecting a second imaging light onto a photoresist layer, the second imaging light having a strong dipole component in the second direction.

11. A method of forming a semiconductor structure comprising:
   forming a hard mask on a dielectric layer;
   forming a first patterned photoresist layer on the hard mask, the forming the first patterned photoresist layer including projecting a first imaging light onto a photoresist layer, the first imaging light having a strong dipole component in the first direction;
   etching the hard mask exposed by the first patterned photoresist layer to form a first elongated opening and a second elongated opening, the first elongated opening having a depth, a length extending in a first direction and a width extending in a second direction, the length being larger than the width and the second elongated opening having a depth, a length extending in the second direction and a width extending in the first direction, the length being larger than the width, the first elongated opening having a bottom surface that lies above and spaced apart from a top surface of the dielectric layer, the second elongated opening having a bottom surface that lies above and spaced apart from the top surface of the dielectric layer, the second direction being substantially orthogonal to the first direction;
   removing the first patterned photoresist layer;
   forming a second patterned photoresist layer on the hard mask after the first patterned photoresist layer has been removed, the forming the second patterned photoresist layer including projecting a second imaging light onto a photoresist layer, the second imaging light having a strong dipole component in the second direction; and
   etching the hard mask exposed by the second patterned photoresist layer to form a third elongated opening and a fourth elongated opening, the third elongated opening exposing a first region on the top surface of the dielectric layer, and having a length larger than a width wherein the length extends in the first direction, the fourth elongated opening exposing a second region on the top surface of the dielectric layer, and having a length larger than a width wherein the length extends in the second direction.

12. The method of claim 11 wherein:
   the hard mask includes a first material and a second material that touches and lies over the first material, the second material being different from the first material; and
   the first and second elongated openings each extends through the second material to expose a region of the first material.

13. The method of claim 11 and further comprising etching the first region and the second region on the top surface of the dielectric layer to form a first elongated metal contact opening and a second elongated metal contact opening,
   the first elongated metal contact opening having a longitudinal axis that lies in the first direction, and exposing a first elongated source region that has a longitudinal axis lying in the first direction,
   the second elongated metal contact opening having a longitudinal axis that lies in the second direction, and exposing a second elongated source region that has a longitudinal axis lying in the second direction.

14. The method of claim 13 and further comprising forming a first elongated source silicide layer on the first elongated source region, and a second elongated source silicide layer on the second elongated source region.

15. The method of claim 14 and further comprising forming a first elongated metal contact on the first elongated source silicide layer, and a second elongated metal contact on the second elongated source silicide layer.

16. The method of claim 15 wherein the first elongated metal contact has a longitudinal axis in the first direction, and the second elongated metal contact has a longitudinal axis in the second direction.

17. The method of claim 16 wherein the first elongated metal contact has a width that is substantially smaller than a width of the second elongated metal contact.

* * * * *